(12) United States Patent
Fujii et al.

(10) Patent No.: US 8,541,161 B2
(45) Date of Patent: Sep. 24, 2013

(54) ACTINIC RAY-SENSITIVE OR RADIATION-SENSITIVE RESIN COMPOSITION, RESIST FILM USING THE SAME AND PATTERN FORMING METHOD

(75) Inventors: Kana Fujii, Shizuoka (JP); Shuji Hirano, Shizuoka (JP); Shinki Yamada, Shizuoka (JP); Toru Fujimori, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/257,069

(22) PCT Filed: Mar. 23, 2010

(86) PCT No.: PCT/JP2010/055495
§ 371 (c)(1),
(2), (4) Date: Sep. 16, 2011

(87) PCT Pub. No.: WO2010/110472
PCT Pub. Date: Sep. 30, 2010

(65) Prior Publication Data
US 2012/0003586 A1    Jan. 5, 2012

(30) Foreign Application Priority Data

Mar. 26, 2009 (JP) ................. 2009-077760
Dec. 18, 2009 (JP) ................. 2009-288255

(51) Int. Cl.
*G03F 7/039*    (2006.01)
*G03F 7/20*    (2006.01)
*G03F 7/30*    (2006.01)

(52) U.S. Cl.
USPC ........ 430/270.1; 430/910; 430/921; 430/925; 430/311; 430/326

(58) Field of Classification Search
None
See application file for complete search history.

(56) References Cited

U.S. PATENT DOCUMENTS

| | | |
|---|---|---|
| 4,491,628 A | 1/1985 | Ito et al. |
| 2003/0134225 A1 | 7/2003 | Fujimori et al. |
| 2008/0248419 A1 | 10/2008 | Hirano |
| 2010/0304299 A1* | 12/2010 | Dimov et al. .............. 430/270.1 |

FOREIGN PATENT DOCUMENTS

| | | |
|---|---|---|
| JP | 5-249682 A | 9/1993 |
| JP | 9-211866 A | 8/1997 |
| JP | 2000-352822 A | 12/2000 |
| JP | 2002-49156 A | 2/2002 |
| JP | 2003-167333 A | 6/2003 |
| JP | 2004-246326 A | 9/2004 |
| JP | 2008-268875 A | 11/2008 |

OTHER PUBLICATIONS

International Search Report dated May 11, 2010 from the International Searching Authority in counterpart international application No. PCT/JP2010/055495.
Written Opinion of the International Searching Authority issued May 11, 2010 in counterpart international application No. PCT/JP2010/055495.

* cited by examiner

*Primary Examiner* — Sin J. Lee
(74) *Attorney, Agent, or Firm* — Sughrue Mion, PLLC

(57) ABSTRACT

Provided are an actinic ray-sensitive or radiation-sensitive resin composition; a resist film using the composition; and a pattern forming method. The actinic ray-sensitive or radiation-sensitive resin composition includes (A) a resin capable of increasing the solubility in an alkali developer by the action of an acid, the resin containing a repeating unit represented by formula (I), a repeating unit represented by formula (II) and a repeating unit represented by formula (III), and (B) a compound capable of generating a fluorine atom-containing acid upon irradiation with an actinic ray or radiation:

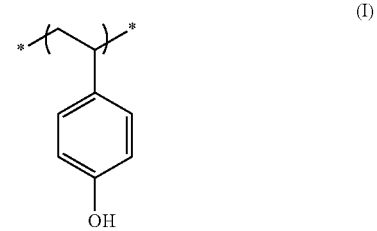

(I)

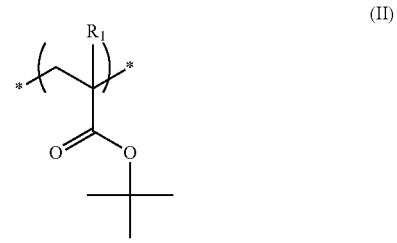

(II)

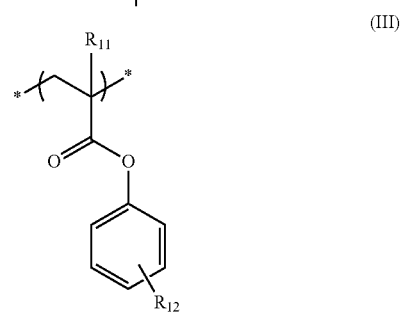

(III)

wherein each of $R_1$ and $R_{11}$ independently represents a hydrogen atom or an alkyl group which may have a substituent, and $R_{12}$ represents a phenyl group which may have a substituent.

10 Claims, No Drawings

ACTINIC RAY-SENSITIVE OR RADIATION-SENSITIVE RESIN COMPOSITION, RESIST FILM USING THE SAME AND PATTERN FORMING METHOD

TECHNICAL FIELD

The present invention relates to an actinic ray-sensitive or radiation-sensitive resin composition, particularly, an actinic ray-sensitive or radiation-sensitive resin composition suitably usable for the production of a semiconductor integrated circuit device, a mask for integrated circuit production, a printed wiring board, a liquid crystal panel and the like, a resist film using the composition, and a pattern forming method.

BACKGROUND ART

An early chemical amplification positive resist composition composed of a photo-acid generator and a resin protected by an acid-decomposable group is disclosed, for example, in U.S. Pat. No. 4,491,628. This chemical amplification positive resist composition is a pattern forming material of forming a pattern on a substrate by producing an acid in the exposed area upon irradiation with radiation such as far ultraviolet light and through a reaction using the acid as a catalyst, changing the developer solubility of the area irradiated with actinic radiation and that of the non-irradiated area.

Various positive resist compositions containing a resin protected by an acid-decomposable group have been heretofore known, and for example, JP-A-5-249682 (the term "JP-A" as used herein means an "unexamined published Japanese patent application") discloses a resist composition using a polyhydroxystyrene resin protected by an alkoxy (acetal) group, JP-A-9-211866 discloses a resist composition using a polyhydroxystyrene resin protected by two different acid-decomposable groups, JP-A-2000-352822 discloses a resist composition using a resin protected by an acetal group having a heterocyclic group at the terminal through a linking group, JP-A-2002-49156 discloses a resist composition using a polyhydroxystyrene resin protected by two different acetal groups, and JP-A-2004-246326 discloses a resist composition using a polyhydroxystyrene resin protected by an acid-decomposable group containing a group (heterocycle) having absorption at 248 nm.

However, when a high-reflection substrate is used directly without an antireflection film as in the case of forming a pattern for implantation involving ion injection or the like, a general positive resist composition causes an increase in the swing amplitude or production of a strong standing wave. In this respect, improvements are demanded. It is also required to improve the performance in terms of resolution and film loss.

SUMMARY OF INVENTION

An object of the present invention is to provide: an actinic ray-sensitive or radiation-sensitive resin composition capable of solving the above-described problems, particularly, an actinic ray-sensitive or radiation-sensitive resin composition ensuring that even when a high-reflection substrate is directly used without an antireflection film, increase of a swing amplitude and generation of a standing wave are suppressed and high resolution and little film loss are achieved; a resist film using the composition; and a pattern forming method.

The present inventors have made intensive studies, as a result, the object of the present invention has been attained by the following constructions.

<1> An actinic ray-sensitive or radiation-sensitive resin composition including:

(A) a resin capable of increasing the solubility in an alkali developer by the action of an acid, the resin containing a repeating unit represented by formula (I), a repeating unit represented by formula (II) and a repeating unit represented by formula (III), and (B) a compound capable of generating a fluorine atom-containing acid upon irradiation with an actinic ray or radiation:

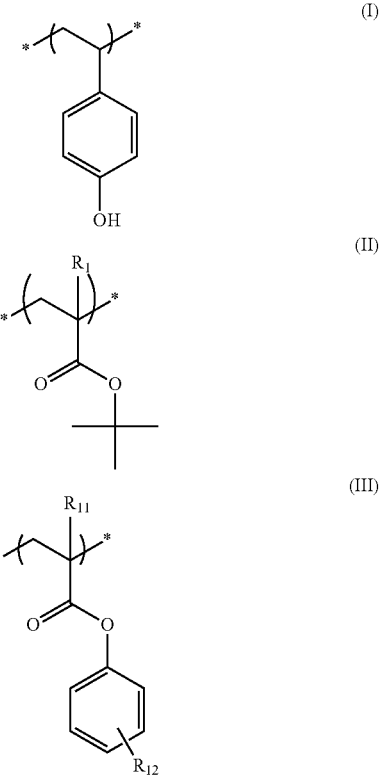

wherein each of $R_1$ and $R_{11}$ independently represents a hydrogen atom or an alkyl group which may have a substituent, and $R_{12}$ represents a phenyl group which may have a substituent.

<2> The actinic ray-sensitive or radiation-sensitive resin composition as described in <1> above, wherein the contents of the repeating unit represented by formula (I), the repeating unit represented by formula (II) and the repeating unit represented by formula (III) are from 50 to 80 mol %, from 15 to 49 mol % and from 0.5 to 10 mol %, respectively, based on all repeating units of the resin (A).

<3> The actinic ray-sensitive or radiation-sensitive resin composition as described in <1> or <2> above, wherein the contents of the repeating unit represented by formula (I), the repeating unit represented by formula (II) and the repeating unit represented by formula (III) are from 60 to 75 mol %, from 20 to 39 mol % and from 1 to 9 mol %, respectively, based on all repeating units of the resin (A).

<4> The actinic ray-sensitive or radiation-sensitive resin composition as described in any one of <1> to <3> above, further including (B') a compound capable of generating a fluorine atom-free acid upon irradiation with an actinic ray or radiation.

<5> The actinic ray-sensitive or radiation-sensitive resin composition as described in any one of <1> to <4> above, wherein each of $R_1$ in formula (I) and $R_{11}$ in formula (II) is a methyl group (a methyl group having no substituent).

<6> The actinic ray-sensitive or radiation-sensitive resin composition as described in any one of <1> to <5> above, wherein $R_{12}$ in formula (III) is a phenyl group (a phenyl group having no substituent).

<7> The actinic ray-sensitive or radiation-sensitive resin composition as described in any one of <1> to <6> above, further including (D) a compound having three or more hydroxyl or substituted hydroxyl groups.

<8> The actinic ray-sensitive or radiation-sensitive resin composition as described in <7> above, wherein the compound (D) is a cyclic or chain sugar derivative.

<9> A resist film formed of the actinic ray-sensitive or radiation-sensitive resin composition described in any one of <1> to <8> above.

<10> A pattern forming method including steps of exposing and developing the resist film described in <9> above.

DESCRIPTION OF EMBODIMENTS

The present invention is described in detail below.

Incidentally, in the present invention, when a group (atomic group) is denoted without specifying whether substituted or unsubstituted, the group includes both a group having no substituent and a group having a substituent. For example, "an alkyl group" includes not only an alkyl group having no substituent (unsubstituted alkyl group) but also an alkyl group having a substituent (substituted alkyl group).

In the present invention, the term "actinic ray" or "radiation" indicates, for example, a bright line spectrum of mercury lamp, a far ultraviolet ray typified by excimer laser, an extreme-ultraviolet ray (EUV light), an X-ray or an electron beam. Also, in the present invention, the "light" means an actinic ray or radiation.

Furthermore, in the present invention, unless otherwise indicated, the "exposure" includes not only exposure to a mercury lamp, a far ultraviolet ray typified by excimer laser, an extreme-ultraviolet ray, an X-ray, EUV light or the like but also lithography with a particle beam such as electron beam and ion beam.

The actinic ray-sensitive or radiation-sensitive resin composition of the present invention includes (A) a resin capable of increasing the solubility in an alkali developer by the action of an acid, the resin containing a repeating unit represented by formula (I), a repeating unit represented by formula (II) and a repeating unit represented by formula (III), and (B) a compound capable of generating a fluorine atom-containing acid upon irradiation with an actinic ray or radiation.

Respective components blended in the actinic ray-sensitive or radiation-sensitive resin composition of the present invention are described below.

[1] (A) Resin Capable of Increasing the Solubility in an Alkali Developer by the Action of an Acid, the Resin Containing a Repeating Unit Represented by Formula (I), a Repeating Unit Represented by Formula (II) and a Repeating Unit Represented by Formula (III)

The actinic ray-sensitive or radiation-sensitive resin composition of the present invention contains (A) a resin capable of increasing the solubility in an alkali developer by the action of an acid, the resin containing a repeating unit represented by formula (I), a repeating unit represented by formula (II) and a repeating unit represented by formula (III).

The resin (A) is preferably insoluble or sparingly soluble in an alkali developer.

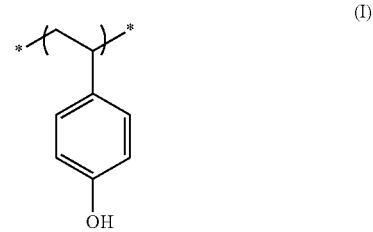

(I)

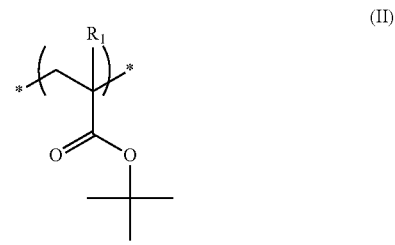

(II)

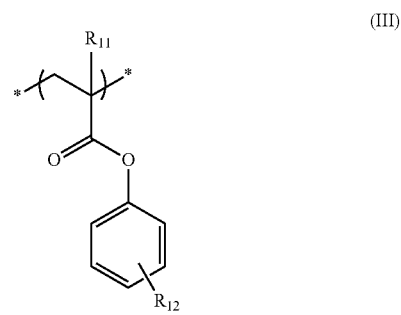

(III)

Each of $R_1$ and $R_{11}$ independently represents a hydrogen atom or an alkyl group which may have a substituent.

$R_{12}$ represents a phenyl group which may have a substituent.

The alkyl group of $R_1$ and $R_{11}$ may be either linear or branched and may have a substituent. The linear alkyl group is preferably an alkyl group having a carbon number of 1 to 30, more preferably from 1 to 20, and examples thereof include a methyl group, an ethyl group, an n-propyl group, an n-butyl group, an n-pentyl group, an n-hexyl group, an n-heptyl group, an n-octyl group, an n-nonyl group and an n-decanyl group. The branched alkyl group is preferably an alkyl group having a carbon number of 3 to 30, more preferably from 3 to 20, and examples thereof include an i-propyl group, an i-butyl group, a sec-butyl group, a tert-butyl group, an i-pentyl group, a tert-pentyl group, an i-hexyl group, a tert-hexyl group, an i-heptyl group, a tert-heptyl group, an i-octyl group, a tert-octyl group, an i-nonyl group and a tert-decanoyl group.

The alkyl group of $R_1$ and $R_{11}$ is preferably a linear alkyl group, more preferably a methyl group.

Each of $R_1$ and $R_{11}$ is independently preferably a hydrogen atom or a methyl group (a methyl group having no substituent), more preferably a methyl group (a methyl group having no substituent).

Examples of the substituent which the alkyl group may further have include a hydroxyl group, a halogen atom (e.g., fluorine, chlorine, bromine, iodine), a nitro group, a cyano group, an alkoxy group (e.g., methoxy, ethoxy, hydroxyethoxy, propoxy, hydroxypropoxy, n-butoxy, isobutoxy, sec-butoxy, tert-butoxy), an alkoxycarbonyl group (e.g., methoxycarbonyl, ethoxycarbonyl), an aralkyl group (e.g., benzyl, phenethyl, cumyl), an aralkyloxy group, an acyl group (e.g., formyl, acetyl, butyryl, benzoyl, cinnamyl, valeryl), an acyloxy group (e.g., butyryloxy), an alkenyl group (e.g., vinyl, allyl, butenyl, cyclohexenyl), an alkenyloxy group (e.g., vinyloxy, propenyloxy, allyloxy, butenyloxy), an aryl group (e.g., phenyl, naphthyl, anthryl), an aryloxy group (e.g., phenoxy) and an aryloxycarbonyl group (e.g., benzoyloxy).

The phenyl group as $R_{12}$ may one substituent or two or more substituents. Specific examples of the substituent include an alkyl group and the same groups as described for the substituent which the alkyl group above may have. Of these, an alkyl group having a carbon number of 1 to 4 and a halogen atom are preferred.

However, $R_{12}$ is preferably a phenyl group having no substituent.

The substitution position of $R_{12}$ with respect to the benzene ring of the phenyl (meth)acrylate unit represented by formula (III) may be any of the ortho-position, the meta-position and the para-position but is preferably the para-position.

Specific examples of the repeating unit represented by formula (III) are set forth below, but the present invention is not limited thereto.

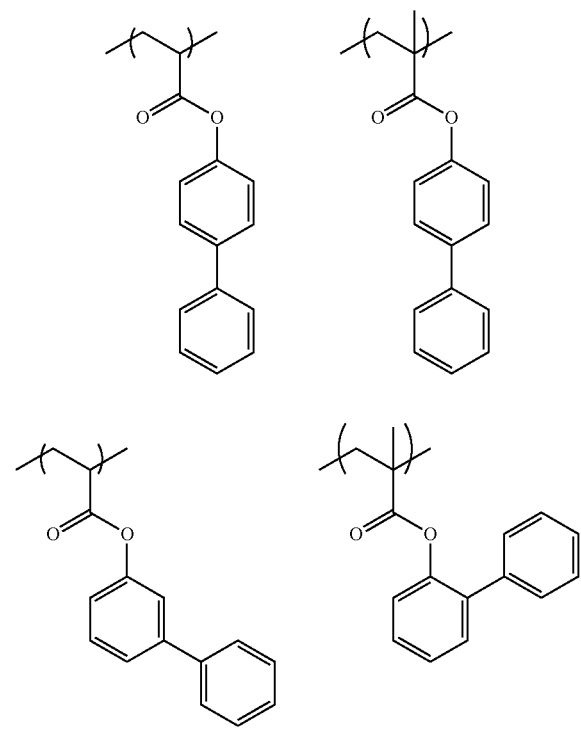

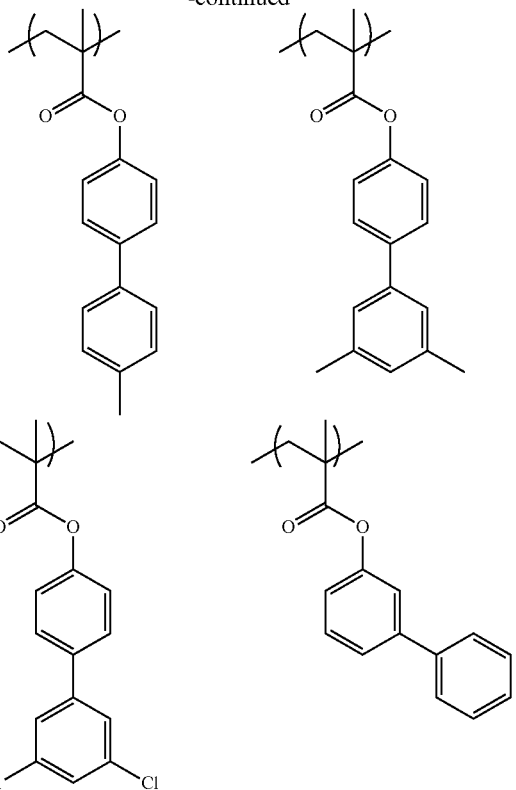

The contents of the repeating unit represented by formula (I), the repeating unit represented by formula (II) and the repeating unit represented by formula (III) are preferably from 50 to 80 mol %, from 15 to 49 mol % and from 0.5 to 10 mol %, respectively, more preferably from 60 to 75 mol %, from 20 to 39 mol % and from 1 to 9 mol %, respectively, based on all repeating units of the resin (A). Within these ranges, an actinic ray-sensitive or radiation-sensitive resin composition enabling it to more successfully suppress increase of a swing amplitude and generation of a standing wave and achieve higher resolution and less film loss can be obtained.

The resin (A) is a resin capable of increasing the solubility in an alkali developer by the action of an acid (acid-decomposable resin) and contains, in a repeating unit, a group capable of decomposing by the action of an acid to produce an alkali-soluble group (acid-decomposable group).

In the resin (A), the acid-decomposable group is a group formed by substituting a group capable of leaving by the action of an acid for a hydrogen atom of an alkali-soluble group, more specifically, a group formed by substituting a tert-butyl group for a hydrogen atom of —COOH in the repeating unit represented by formula (II). That is, a tert-butoxycarbonyl group comes under the acid-decomposable group.

Incidentally, (meth)acrylic acid ester monomers corresponding, for example, to the repeating units represented by formulae (II) and (III) can be synthesized by esterifying a (meth)acrylic acid chloride and an alcohol compound in a solvent such as THF, acetone and methylene chloride in the presence of a basic catalyst such as triethylamine, pyridine and DBU. A commercially available product may also be used.

The resin (A) can be synthesized using a conventional polymerization method.

The weight average molecular weight (Mw) of the resin (A) is preferably from 3,000 to 100,000, more preferably from 5,000 to 50,000. The weight average molecular weight is preferably 100,000 or less in view of dissolution rate of the resin itself in an alkali developer and sensitivity.

The polydispersity (Mw/Mn) of the resin (A) is preferably from 1.0 to 3.0, more preferably from 1.0 to 2.0.

Here, the weight average molecular weight (Mw) and the polydispersity (Mw/Mn) are determined by GPC (gel permeation chromatography) with a polystyrene standard.

The amount of the resin (A) added is not particularly limited but is, in terms of the total amount, preferably from 20 to 99 mass %, more preferably from 30 to 98 mass %, based on the entire solid content of the actinic ray-sensitive or radiation-sensitive resin composition.

The actinic ray-sensitive or radiation-sensitive resin composition of the present invention may contain two or more kinds of resins. In this case, the composition may contain two or more kinds of resins (A), or may contain one or more kinds of resins other than the resin (A) within the range not impairing the effects of the present invention, in addition to one or more kinds of resins (A).

Specific examples of the (A) resin are set forth below, but the present invention is not limited thereto.

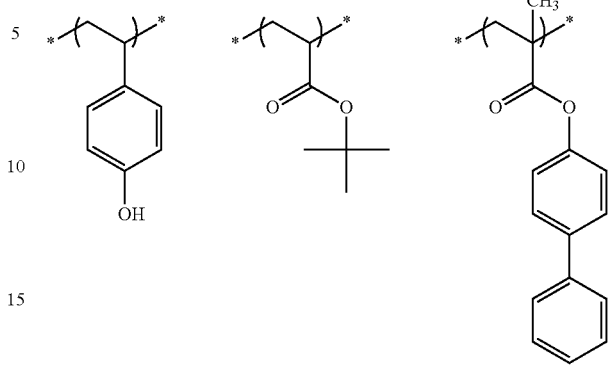

A-3

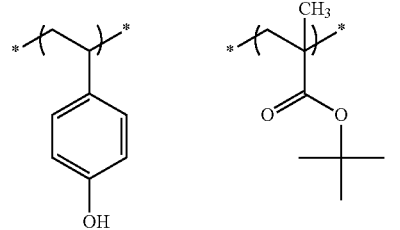

A-4

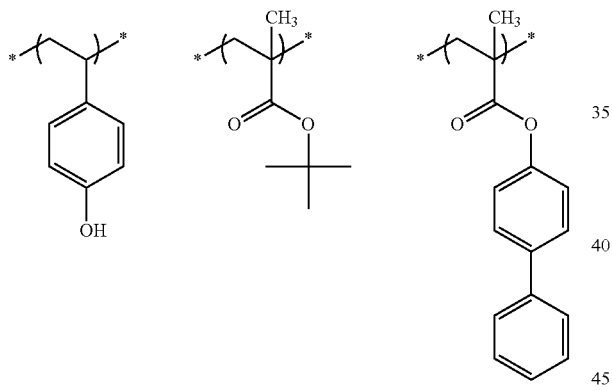

A-1

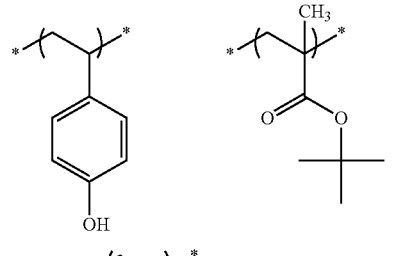

A-5

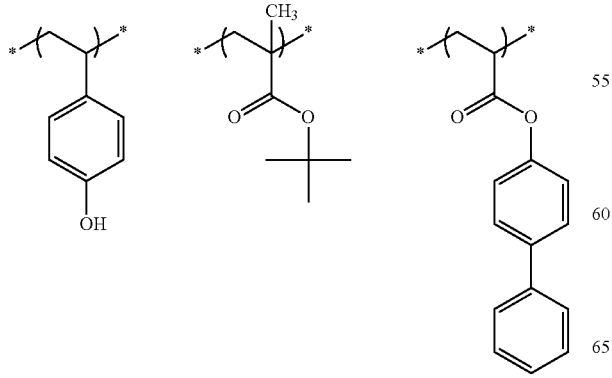

A-2

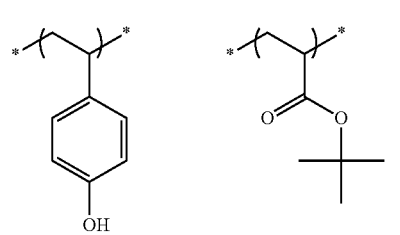

A-6

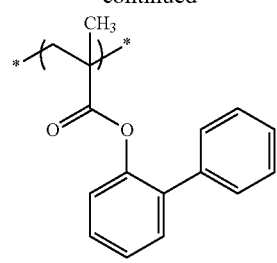

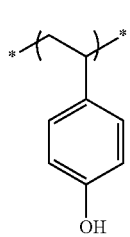 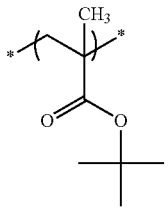

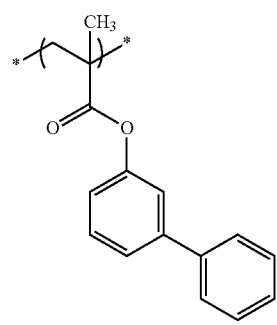

A-7

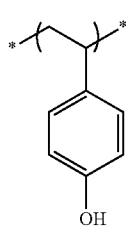 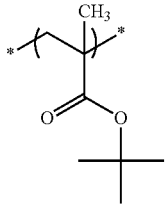

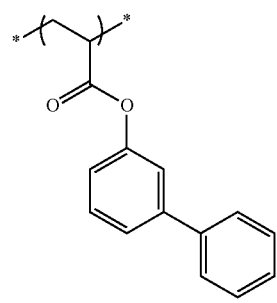

A-8

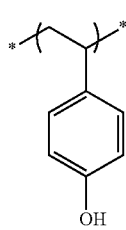 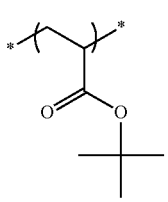

A-9

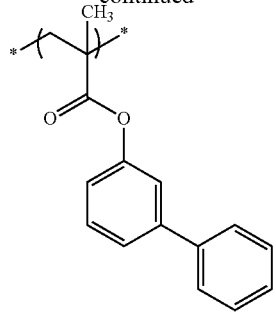

[2] (B) Compound Capable of Generating a Fluorine Atom-Containing Acid Upon Irradiation with an Actinic Ray or Radiation The actinic ray-sensitive or radiation-sensitive resin composition of the present invention contains (B) a compound capable of generating a fluorine atom-containing acid upon irradiation with an actinic ray or radiation (hereinafter, sometimes referred to as an "acid generator (B)" or a "component (B)").

The component (B) is preferably an onium salt, and the cation of the onium salt is preferably a sulfonium cation or an iodonium cation.

The counter anion of the onium cation is preferably a sulfonate anion having a fluorine atom, more preferably an alkylsulfonate anion substituted by a fluorine atom or an arylsulfonate anion substituted by a fluorine atom or an alkyl fluoride group, still more preferably an alkylsulfonate anion substituted by a fluorine atom.

The alkylsulfonate anion substituted by a fluorine atom is preferably a perfluoroalkylsulfonate anion having a carbon number of 1 to 8, more preferably a perfluoroalkylsulfonate anion having a carbon number of 2 to 6.

The aryl group of the arylsulfonate anion substituted by a fluorine atom or an alkyl fluoride group is preferably a phenyl group.

The counter anion may have a substituent other than a fluorine atom or an alkyl fluoride group. Specific examples of the substituent include an alkyl group, a cycloalkyl group, an alkoxy group and an alkylthio group, but the substituent is not particularly limited.

The component (B) is more specifically a compound represented by the following formula (ZI) or (ZII):

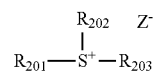 (ZI)

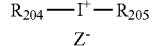 (ZII)

In formula (ZI), each of $R_{201}$, $R_{202}$ and $R_{203}$ independently represents an organic group.

$Z^-$ represents a non-nucleophilic anion having a fluorine atom. Preferred examples thereof include a sulfonate anion substituted by a fluorine atom, a bis(alkylsulfonyl)imide anion substituted by a fluorine atom and a tris(alkylsulfonyl) methide anion substituted by a fluorine atom, and the above-described organic anion having a fluorine atom (that is, an alkylsulfonate anion substituted by a fluorine atom, an arylsulfonate anion substituted by a fluorine atom or an alkyl fluoride group, and the like) is preferred.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group.

Examples of the group formed by combining two members out of $R_{201}$ to $R_{203}$ include an alkylene group (e.g., butylene, pentylene).

The compound may be a compound having a plurality of structures represented by formula (ZI), for example, may be a compound having a structure where at least one of $R_{201}$ to $R_{203}$ in a compound represented by formula (ZI) is bonded to at least one of $R_{201}$ to $R_{203}$ in another compound represented by formula (ZI).

Examples of the organic group of $R_{201}$, $R_{202}$ and $R_{203}$ include an aryl group (preferably having a carbon number of 6 to 15), a linear or branched alkyl group (preferably having a carbon number of 1 to 10), and a cycloalkyl group (preferably having a carbon number of 3 to 15).

At least one of three members $R_{201}$, $R_{202}$ and $R_{203}$ is preferably an aryl group, and it is more preferred that these members all are an aryl group. The aryl group includes a heteroaryl group such as indole residue and pyrrole residue, other than a phenyl group, a naphthyl group and the like.

Each of the aryl group, alkyl group and cycloalkyl group as $R_{201}$, $R_{202}$ and $R_{203}$ may further have a substituent, and examples of the substituent include, but are not limited to, a nitro group, a halogen atom such as fluorine atom, a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7).

Also, two members selected from $R_{201}$, $R_{202}$ and $R_{203}$ may combine through a single bond or a linking group. Examples of the linking group include, but are not limited to, an alkylene group (preferably having a carbon number of 1 to 3), —O—, —S—, —CO— and —SO$_2$—.

The preferred structure when at least one of $R_{201}$, $R_{202}$ and $R_{203}$ is not an aryl group includes cation structures such as compounds described in JP-A-2004-233661, paragraphs 0046 and 0047, and JP-A-2003-35948, paragraphs 0040 to 0046, Compounds (1-1) to (1-70) set forth in U.S. Patent Application Publication No. 2003/0224288A1, and Compounds (IA-1) to (IA-54) and (IB-1) to (IB-24) set forth in U.S. Patent Application Publication No. 2003/0077540A1. In particular, when at least one of $R_{201}$, $R_{202}$ and $R_{203}$ is not an aryl group, the following embodiments (1) and (2) are preferred.

(1) Embodiment where at least one of $R_{201}$, $R_{202}$ and $R_{203}$ is a structure represented by Ar—CO—X— and remaining two members are a linear or branched alkyl group or a cycloalkyl group At this time, the remaining two linear or branched alkyl groups or cycloalkyl groups may combine with each other to form a ring structure. Here, Ar represents an aryl group which may have a substituent, and is specifically the same as the aryl group of $R_{201}$, $R_{202}$ and $R_{203}$. A phenyl group which may have a substituent is preferred.

X represents an alkylene group which may have a substituent, and is specifically an alkylene group having a carbon number of 1 to 6. An alkylene group having a linear or branched structure with a carbon number of 1 to 3 is preferred.

The remaining two linear or branched alkyl groups or cycloalkyl groups preferably have a carbon number of 1 to 6. Such an atomic group may further have a substituent. Also, it is preferred that these groups are combined with each other to form a ring structure (preferably a 5- to 7-membered ring).

(2) Embodiment where at least one of $R_{201}$, $R_{202}$ and $R_{203}$ is an aryl group which may have a substituent and remaining two members are a linear or branched alkyl group or a cycloalkyl group At this time, the aryl group is specifically the same as the aryl group of $R_{201}$, $R_{202}$ and $R_{203}$ and is preferably a phenyl group or a naphthyl group. Also, the aryl group preferably has any of a hydroxyl group, an alkoxy group and an alkyl group, as the substituent. The substituent is more preferably an alkoxy group having a carbon number of 1 to 12, still more preferably an alkoxy group having a carbon number of 1 to 6.

The remaining two linear or branched alkyl groups or cycloalkyl groups preferably have a carbon number of 1 to 6. Such an atomic group may further have a substituent. Also, these groups may combine with each other to form a ring structure.

In formula (ZII), each of $R_{204}$ and $R_{205}$ independently represents an aryl group, an alkyl group or a cycloalkyl group.

The aryl group, alkyl group and cycloalkyl group of $R_{204}$ and $R_{205}$ are the same as those described for the aryl group, alkyl group and cycloalkyl group of $R_{201}$ to $R_{203}$ in formula (ZI).

The aryl group, alkyl group and cycloalkyl group of $R_{204}$ and $R_{205}$ may have a substituent. Examples of the substituent include those which the aryl group, alkyl group and cycloalkyl group of $R_{201}$ to $R_{203}$ in formula (ZI) may have.

$Z^-$ has the same meaning as $Z^-$ in formula (ZI), and specific examples thereof are also the same as those described in formula (ZI).

Suitable examples of the component (B) are set forth below but are not limited thereto.

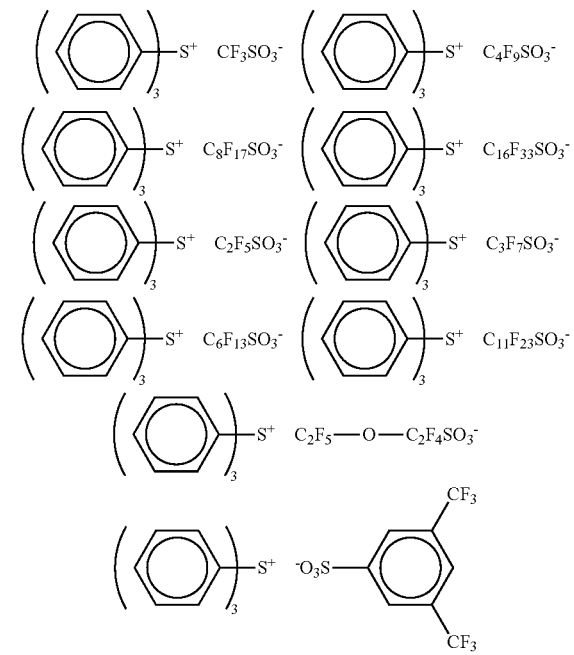

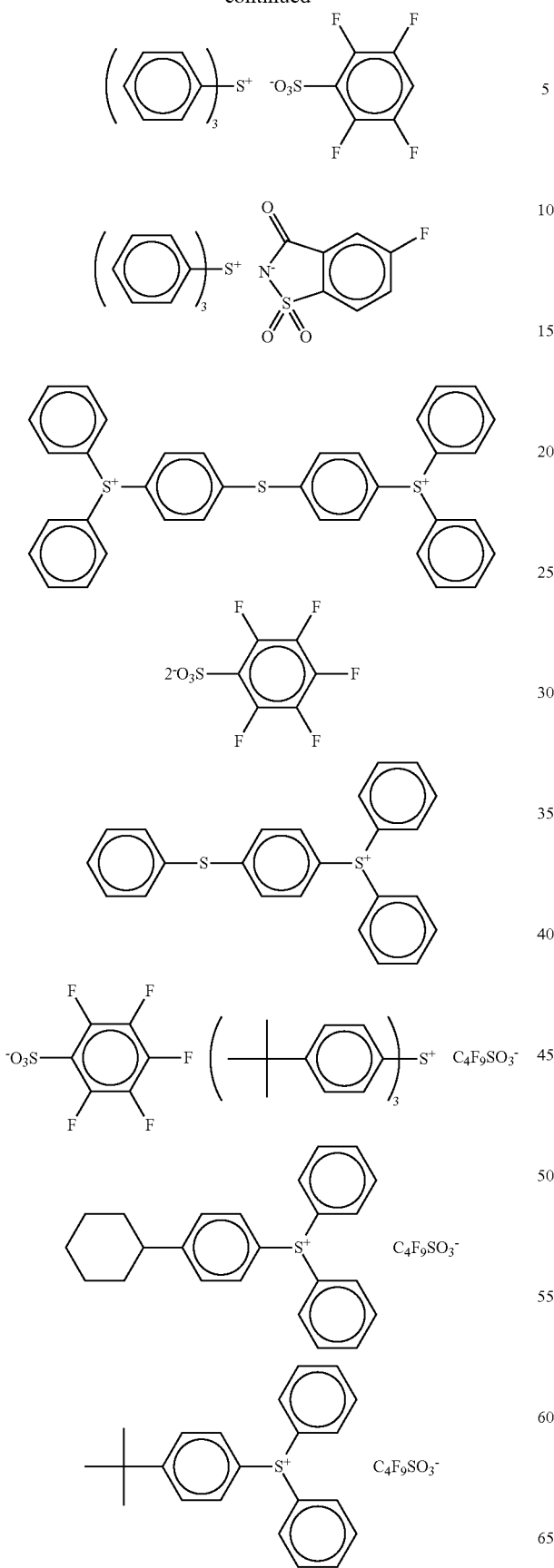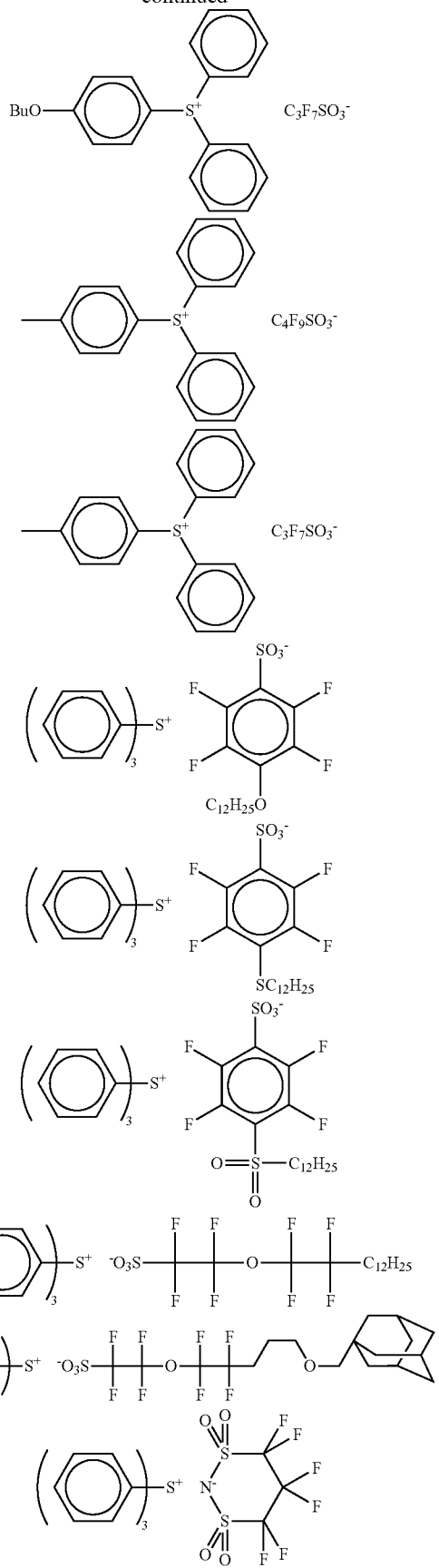

-continued
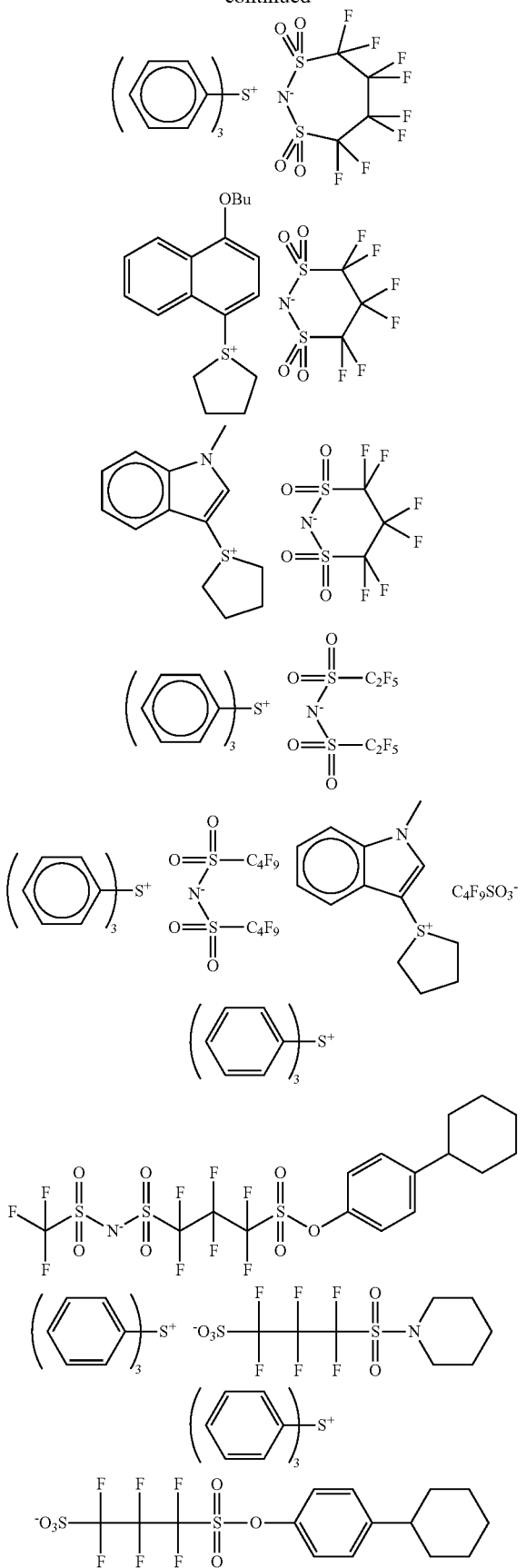
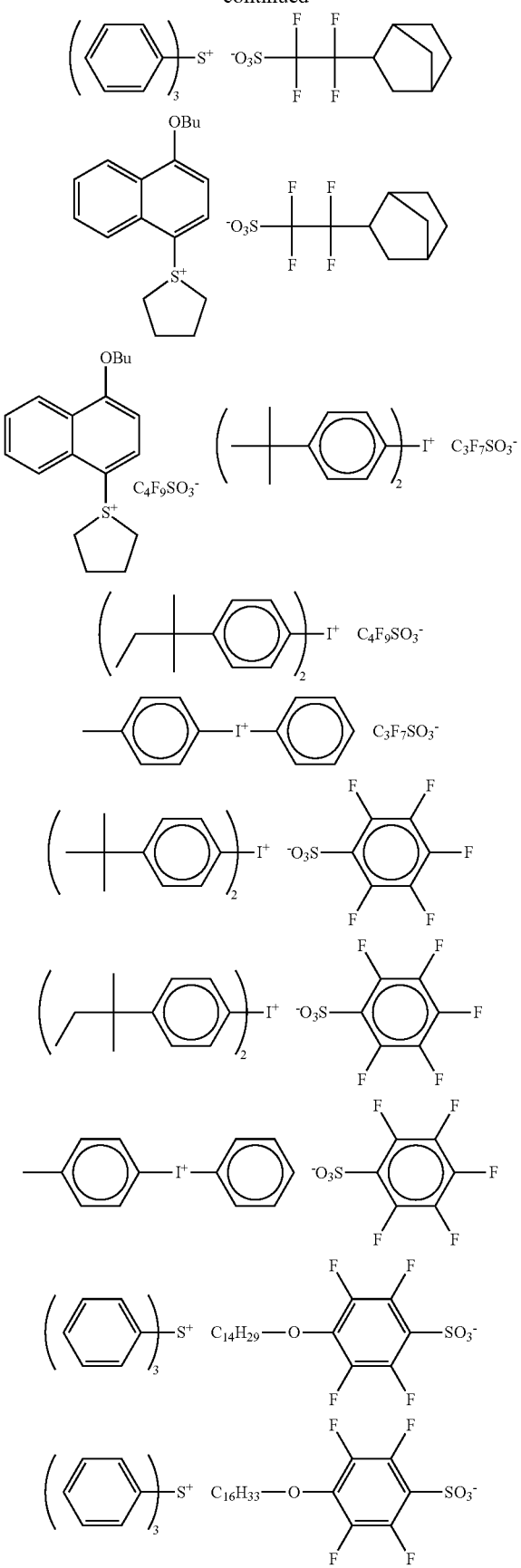

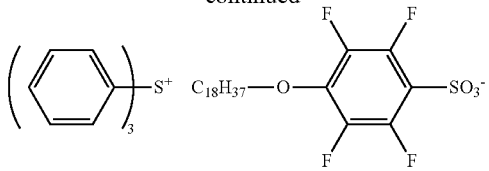

The content of the component (B) is preferably from 0.5 to 25 mass %, more preferably from 1.0 to 15 mass %, based on the entire solid content of the actinic ray-sensitive or radiation-sensitive resin composition.

[3] (B') Compound Capable of Generating a Fluorine Atom-Free Acid Upon Irradiation with an Actinic Ray or Radiation The actinic ray-sensitive or radiation-sensitive resin composition of the present invention may further contain (B') a compound capable of generating a fluorine atom-free acid upon irradiation with an actinic ray or radiation (hereinafter, sometimes referred to as an "acid generator (B')" or a "component (B')").

The component (B') is preferably an onium salt or a diazodisulfone, and the onium cation of the onium salt is more preferably a sulfonium cation or an iodonium cation.

The counter anion of the onium cation is preferably a sulfonate anion, more preferably an alkylsulfonate anion or an arylsulfonate anion.

The alkylsulfonate anion is preferably an alkylsulfonate anion having a carbon number of 1 to 8, more preferably an alkylsulfonate anion having a carbon number of 2 to 6.

The aryl group of the arylsulfonate anion is preferably a phenyl group.

The counter anion may have a substituent (excluding a fluorine atom or a fluorine atom-containing group such as alkyl fluoride group). Specific examples of the substituent include an alkyl group, a cycloalkyl group, an alkoxy group and an alkylthio group, but the substituent is not particularly limited. The substituent is preferably an alkyl group, more preferably an alkyl group having a carbon number of 1 to 4.

The component (B') is more specifically a compound represented by the following formula (ZI'), (ZII') or (ZIII'):

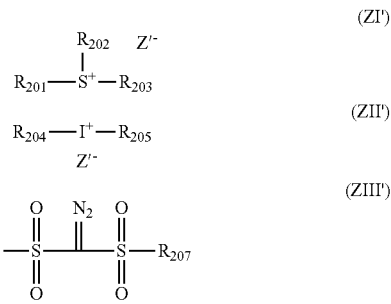

In formulae (ZI') and (ZII'), $R_{201}$ to $R_{205}$ are the same as $R_{201}$ to $R_{205}$ in formulae (ZI) and (ZII).

$Z'^{-}$ represents an acid anion containing no fluorine atom. Specifically, the above-described anion (that is, an alkylsulfonate anion, an arylsulfonate anion and the like) is preferred.

In formula (ZIII'), each of $R_{206}$ and $R_{207}$ represents an alkyl group, a cycloalkyl group or an aryl group and may have a substituent (a fluorine atom and an alkyl fluoride group are excluded from the substituent).

The alkyl group includes a linear or branched alkyl group having a carbon number of 1 to 16 (preferably from 1 to 10).

The cycloalkyl group includes a monocyclic or polycyclic cycloalkyl group having a carbon number of 6 to 20 (preferably from 6 to 10).

The aryl group includes an aryl group having a carbon number of 6 to 20 (preferably from 6 to 10).

Suitable examples of the component (B') are set forth below but are not limited thereto.

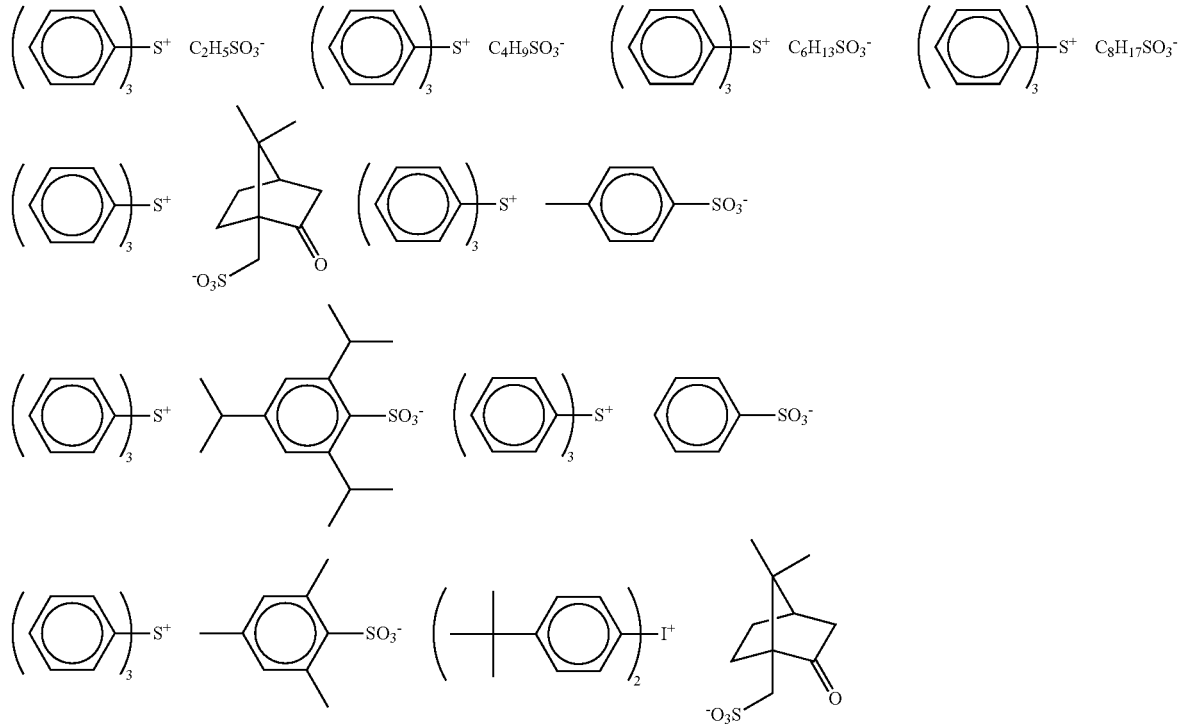

-continued

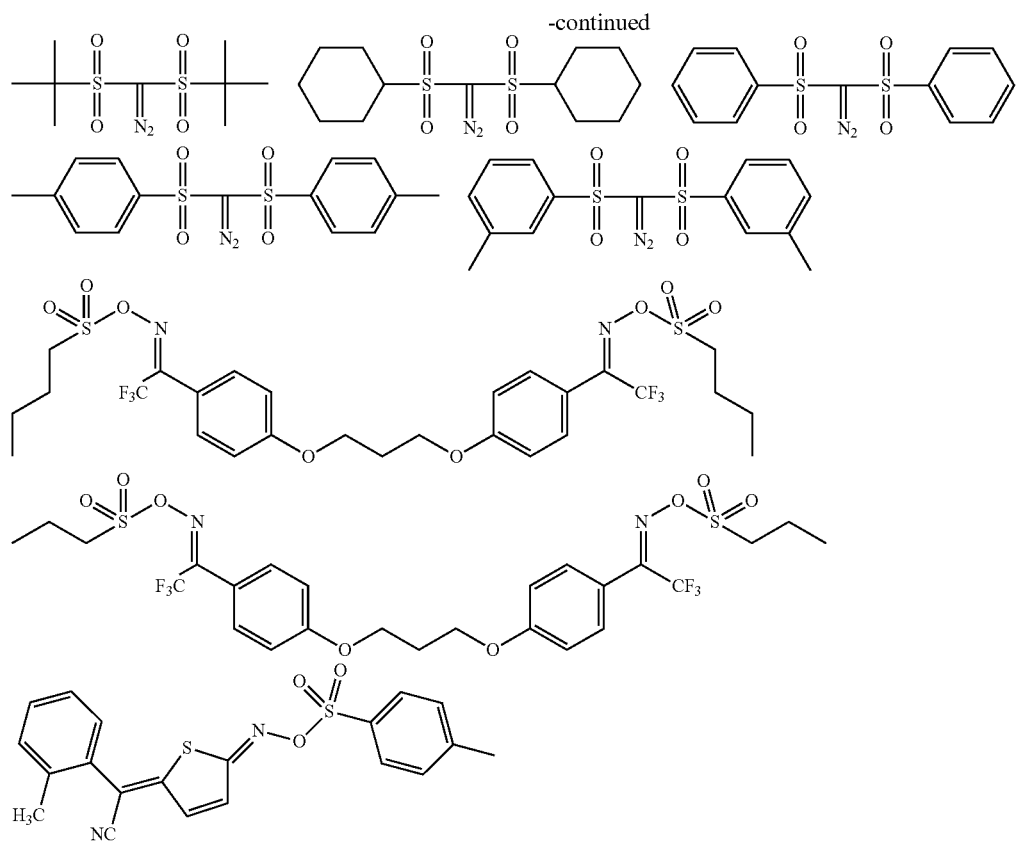

In the case where the actinic ray-sensitive or radiation-sensitive resin composition of the present invention contains the component (B'), the content thereof in the composition is preferably from 0.1 to 5.0 mass %, more preferably from 0.5 to 3 mass %, based on the entire solid content concentration.

[4] (C) Basic Compound

The actinic ray-sensitive or radiation-sensitive resin composition of the present invention preferably contains a basic compound.

The basic compound is preferably a nitrogen-containing organic basic compound. The usable compound is not particularly limited, but for example, compounds classified into the following (1) to (4) are preferably used.

(1) Compound Represented by the Following Formula (BS-1):

(BS-1)

In formula (BS-1), each R independently represents any of a hydrogen tom, an alkyl group (linear or branched), a cycloalkyl group (monocyclic or polycyclic), an aryl group and an aralkyl group, but it is not allowed that three R's all are a hydrogen atom.

The carbon number of the alkyl group as R is not particularly limited but is usually from 1 to 20, preferably from 1 to 12.

The carbon number of the cycloalkyl group as R is not particularly limited but is usually from 3 to 20, preferably from 5 to 15.

The carbon number of the aryl group as R is not particularly limited but is usually from 6 to 20, preferably from 6 to 10. Specific examples thereof include a phenyl group and a naphthyl group.

The carbon number of the aralkyl group as R is not particularly limited but is usually from 7 to 20, preferably from 7 to 11. Specific examples thereof include a benzyl group.

In the alkyl group, cycloalkyl group, aryl group and aralkyl group as R, a hydrogen atom may be replaced by a substituent. Examples of the substituent include an alkyl group, a cycloalkyl group, an aryl group, an aralkyl group, a hydroxyl group, a carboxyl group, an alkoxy group, an aryloxy group, an alkylcarbonyloxy group and an alkyloxycarbonyl group.

In the compound represented by formula (BS-1), it is preferred that only one of three R's is a hydrogen atom or all R's are not a hydrogen atom.

Specific examples of the compound represented by formula (BS-1) include tri-n-butylamine, tri-n-pentylamine, tri-n-octylamine, tri-n-decylamine, triisodecyl amine, dicyclohexylmethyl amine, tetradecyl amine, pentadecylamine, hexadecylamine, octadecylamine, didecylamine, methyloctadecylamine, dimethylundecylamine, N,N-dimethyldodecylamine, methyldioctadecylamine, N,N-dibutylaniline, N,N-dihexylaniline, 2,6-diisopropylaniline and 2,4,6-tri(tert-butyl)aniline.

Also, one preferred embodiment is a compound where in formula (BS-1), at least one R is an alkyl group substituted by a hydroxyl group. Specific examples of the compound include triethanolamine and N,N-dihydroxyethylaniline.

The alkyl group as R may contain an oxygen atom in the alkyl chain to form an oxyalkylene chain. The oxyalkylene group is preferably —CH$_2$CH$_2$O—. Specific examples thereof include tris(methoxyethoxyethyl)amine and compounds illustrated in U.S. Pat. No. 6,040,112, column 3, line 60 et seq.

(2) Compound Having a Nitrogen-Containing Heterocyclic Ring Structure

The heterocyclic structure may or may not have aromaticity, may contain a plurality of nitrogen atoms, and may further contain a heteroatom other than nitrogen. Specific examples thereof include a compound having an imidazole structure (e.g., 2-henylbenzimidazole, 2,4,5-triphenylimidazole), a compound having a piperidine structure (e.g., N-hydroxyethylpiperidine, bis(1,2,2,6,6-pentamethyl-4-piperidyl) sebacate), a compound having a pyridine structure (e.g., 4-dimethylaminopyridine) and a compound having an antipyrine structure (e.g., antipyrine, hydroxyantipyrine).

A compound having two or more ring structures is also suitably used. Specific examples thereof include 1,5-diazabicyclo[4.3.0]non-5-ene and 1,8-diazabicyclo[5.4.0]undec-7-ene.

(3) Phenoxy Group-Containing Amine Compound

The phenoxy group-containing amine compound is a compound where the alkyl group of an amine compound has a phenoxy group at the terminal opposite the nitrogen atom. The phenoxy group may have a substituent such as alkyl group, alkoxy group, halogen atom, cyano group, nitro group, carboxyl group, carboxylic acid ester group, sulfonic acid ester group, aryl group, aralkyl group, acyloxy group and aryloxy group.

The compound preferably has at least one oxyalkylene chain between the phenoxy group and the nitrogen atom. The number of oxyalkylene chains in one molecule is preferably from 3 to 9, more preferably from 4 to 6. Among oxyalkylene chains, —$CH_2CH_2O$— is preferred.

Specific examples thereof include 2-[2-{2-(2,2-dimethoxy-phenoxyethoxy)ethyl}-bis-(2-methoxyethyl)]-amine and Compounds (C1-1) to (C3-3) illustrated in paragraph [0066] of U.S. Patent Application Publication No. 2007/0224539A1.

(4) Ammonium Salt

An ammonium salt may also be arbitrarily used. The ammonium salt is preferably a hydroxide or a carboxylate. More specifically, a tetraalkylammonium hydroxide typified by tetrabutylammonium hydroxide is preferred.

Other examples of the basic compound which can be used include compounds synthesized in Examples of JP-A-2002-363146 and compounds described in paragraph 0108 of JP-A-2007-298569.

One basic compound is used alone, or two or more kinds of basic compounds are used in combination.

The amount of the basic compound used is usually from 0.001 to 10 mass %, preferably from 0.01 to 5 mass %, based on the solid content of the composition.

The molar ratio of [acid generator (component (B) and component (B'))/[basic compound] is preferably from 2.5 to 300. That is, the molar ratio is preferably 2.5 or more in view of sensitivity and resolution and preferably 300 or less from the standpoint of suppressing the reduction in resolution due to thickening of the pattern with aging after exposure until heat treatment. This molar ratio is more preferably from 5.0 to 200, still more preferably from 7.0 to 150.

[5] (D) Compound Having Three or More Hydroxyl or Substituted Hydroxyl Groups

The actinic ray-sensitive or radiation-sensitive resin composition of the present invention may contain (D) a compound having three or more hydroxyl or substituted hydroxyl groups (hereinafter sometimes referred to as a "component (D)"). By incorporating the component (D) into the actinic ray-sensitive or radiation-sensitive resin composition, the composition becomes more hydrophilic and the reactivity at exposure is enhanced. Possibly thanks to this enhanced reactivity, an effect of more successfully suppressing the generation of a standing wave and more raising the resolution can be expected.

The compound having three or more hydroxyl or substituted hydroxyl groups indicates a compound having within the molecule three or more substituents selected from a hydroxyl group and a substituted hydroxyl group.

A chain or cyclic sugar derivative is preferred as the compound of the component (D). Examples of the sugar derivative include pentose, hexose, pseudo-sugars except for monosaccharide, and their peripheral sugars, and the sugar derivative may be substituted by an acid-decomposable group or other substituents.

The substituted hydroxyl group indicates a hydroxyl group substituted by an alkyl group, a cycloalkyl group, an aralkyl group, an aryl group or the like, that is, an alkoxy group, an aralkyloxy group, an aryloxy group or a group capable of forming an ether structure substituted by an acid-decomposable group or further by other groups.

The acid-decomposable group means a group capable of decomposing by the action of an acid and specifically indicates an acetal group, a ketal group, a tert-butoxycarbonyl group, a tert-butyl ester group or the like.

Also, as in the following structure,

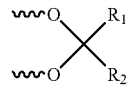

an acid-decomposable group may be formed by bonding two hydroxyl groups. In the formula above, each of $R_1$ and $R_2$ independently represents an alkyl group, a cycloalkyl group, an aralkyl group or an aryl group, and $R_1$ and $R_2$ may combine to form a ring.

Two or more of these acid-decomposable groups may be present at the same time in the same molecule, and it is preferred to have two or more acid-decomposable groups in the same molecule. Furthermore, a compound where at least one acid-decomposable group has the following structure:

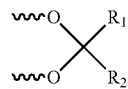

is preferred.

The compound of the component (D) has three or more hydroxyl or substituted hydroxyl groups, and the number of hydroxyl or substituted hydroxyl groups is preferably from 3 to 10, more preferably from 4 to 8.

The molecular weight of the compound of the component (D) is preferably from 150 to 3,000, more preferably from 150 to 1,500.

The compound of the component (D) may be any of the following structures as long as it is a compound satisfying the above-described requirements, but above all, a sugar derivative such as cyclic sugar derivative and chain sugar derivative, and its analogs are preferred.

In the present invention, the cyclic sugar derivative indicates a sugar derivative where a cyclic structure such as alicyclic group is the main skeleton or is present on the side chain. The preferred cyclic structure includes a 5-membered ring, a 6-membered ring and the like, and examples thereof include a cyclohexane ring, a cyclopentane ring and a tetrahydrofuran or tetrahydropyran ring containing an ether oxygen.

Specific examples of the skeleton of the cyclic sugar derivative include arabinose, xylose, fucose, rhamnose, galactose, glucose, fructose, fructopyranose, sorbose, mannose, allopyranose, altrose, talose, tagatose, arabinopyranoside, thiogalactopyranose, mannopyranoside, glucopyranose, glucopyranoside, sucrose, palatinose, lactitol, lactose, maltulose, maltose, maltoside, maltitol, cellobiose, turanose, trehalose, melibiose, maltotriose, melezitose, raffinose, stachyose, maltotetraose, maltohexaose and cyclodextrin.

Examples of the cyclic compound having three or more hydroxyl or substituted hydroxyl groups, such as cyclic sugar derivative, are set forth below, but the present invention is not limited thereto.

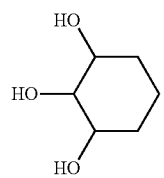

S-1

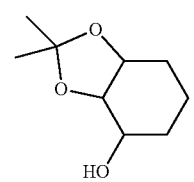

S-2

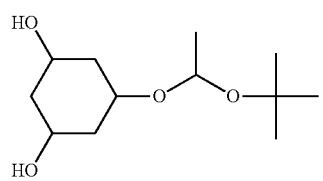

S-3

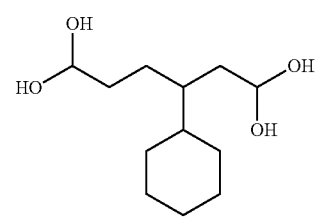

S-4

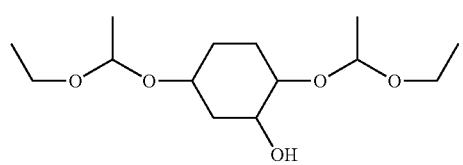

S-5

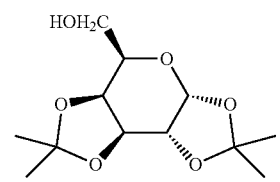

S-6

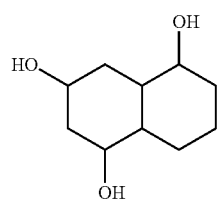

S-7

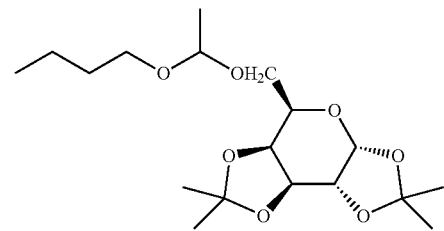

S-8

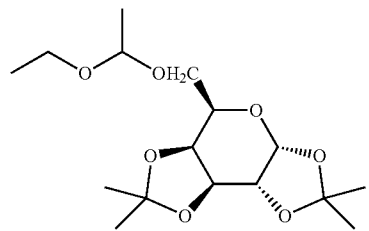

S-9

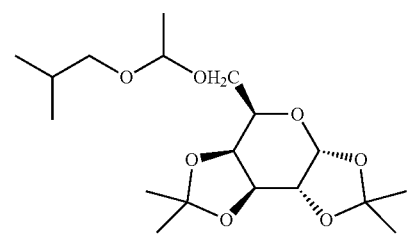

S-10

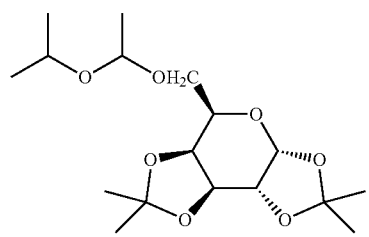

S-11

S-12

-continued
| S-13 | S-14 |
|---|---|
| 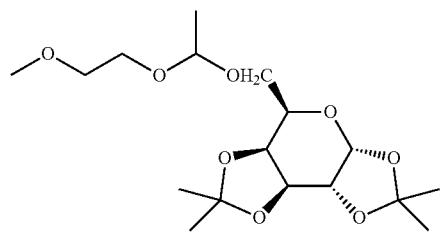 | 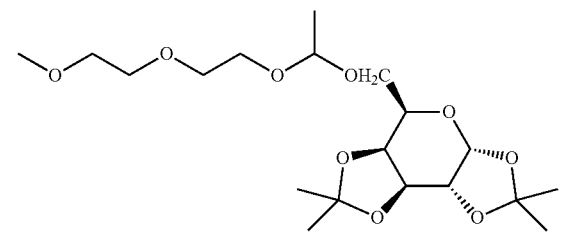 |
| S-15 | S-16 |
| 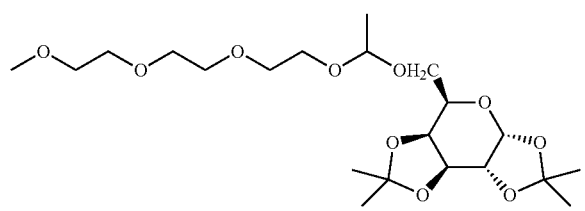 | 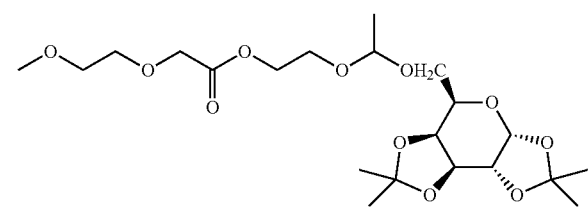 |
| S-17 | S-18 |
| 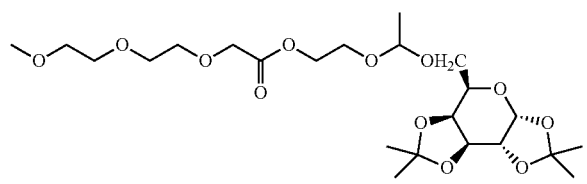 | 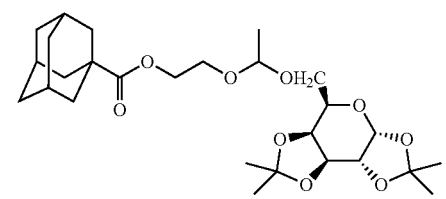 |
| S-19 | S-20 |
| 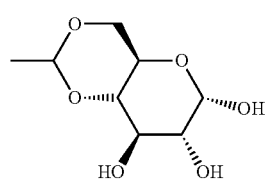 | 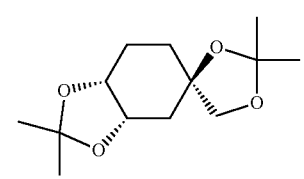 |
| S-21 | S-22 |
| 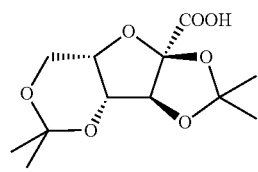 | 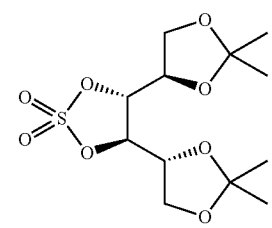 |
| S-23 | S-24 |
| 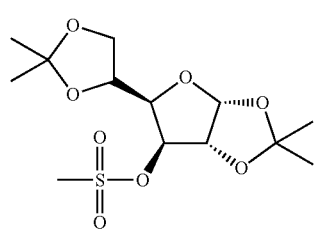 | |
| S-25 | S-26 |
| 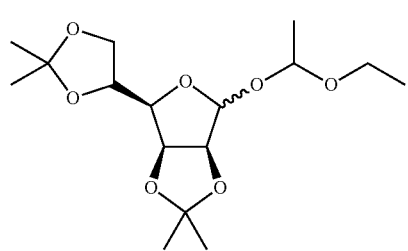 | 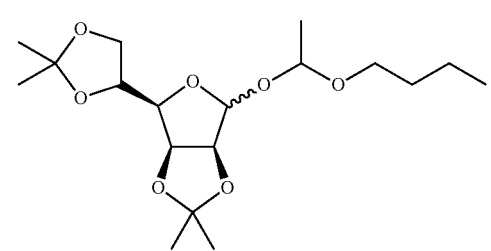 |

-continued
S-27
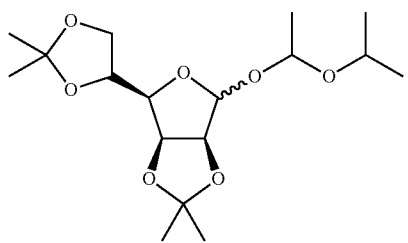
S-28
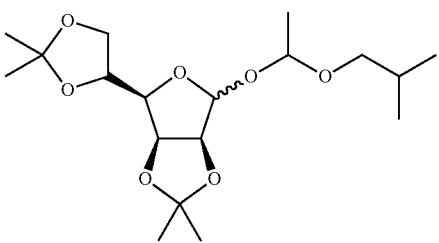
S-29
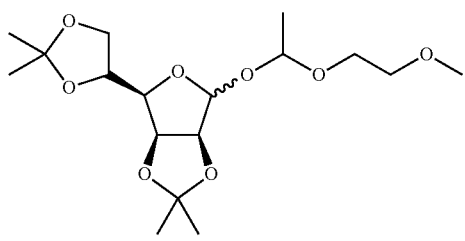
S-30
S-31
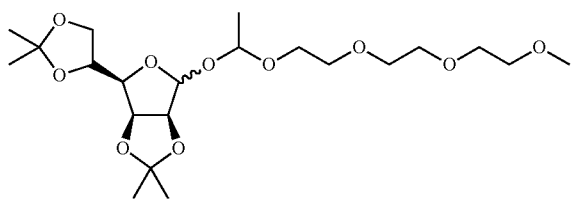
S-32
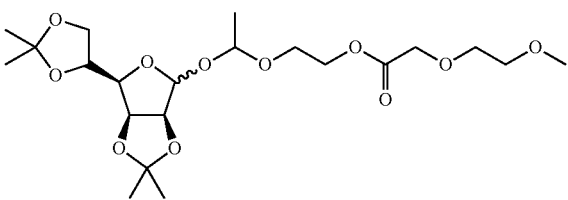
S-33
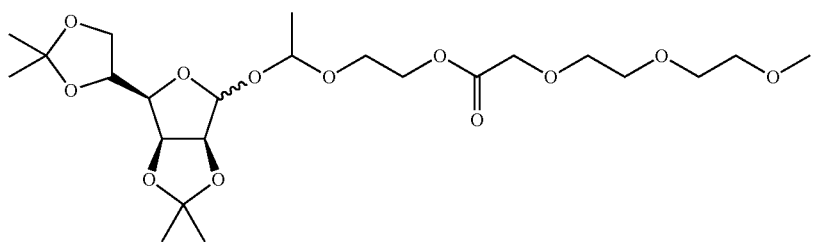
S-34
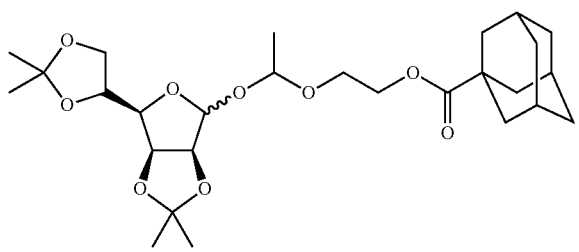
S-35
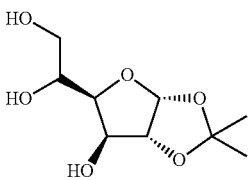
S-36
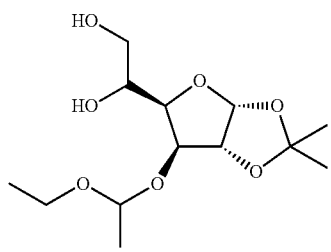
S-37
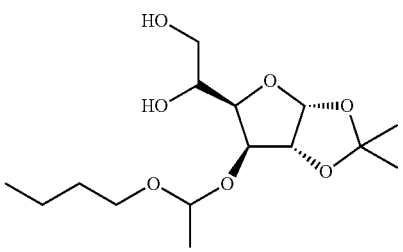

S-38
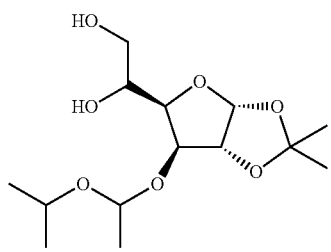
S-39
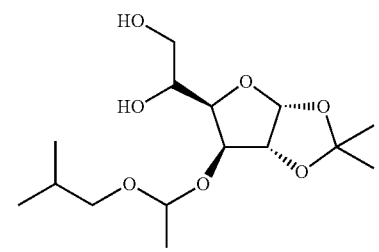
S-40
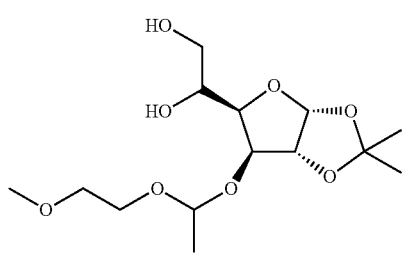
S-41
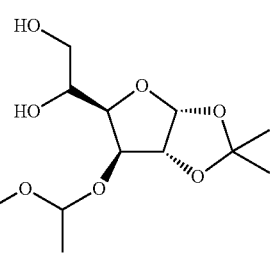
S-42
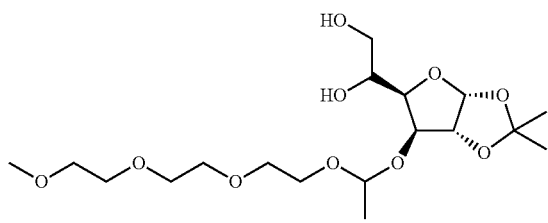
S-43
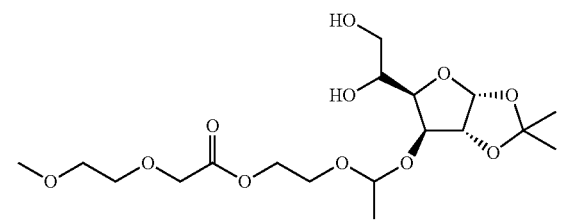
S-44
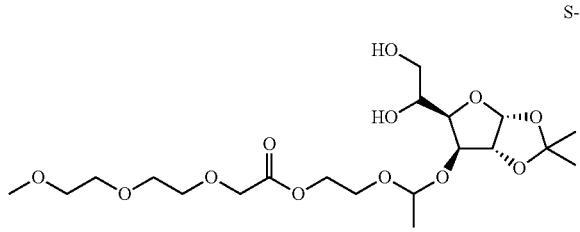
S-45
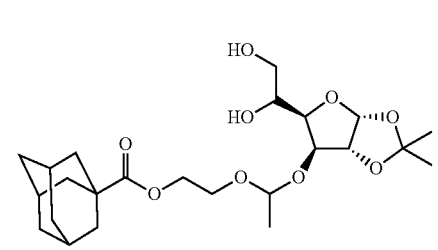
S-46
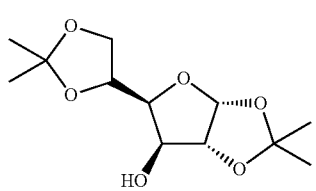
S-47
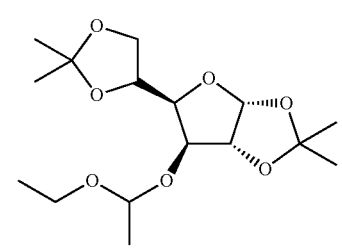
S-48
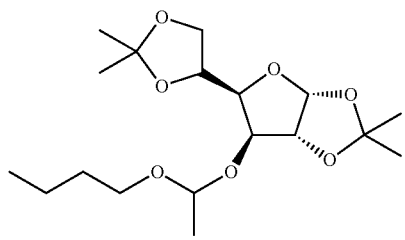
S-49
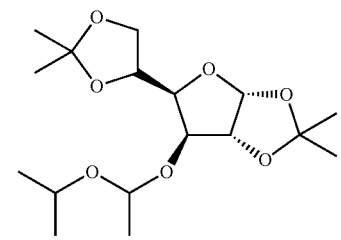

-continued
S-50
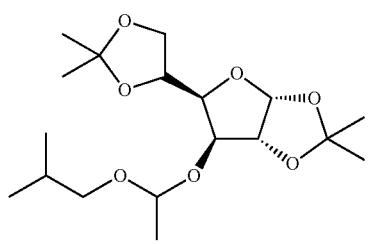
S-51
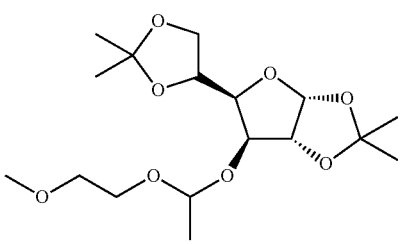
S-52
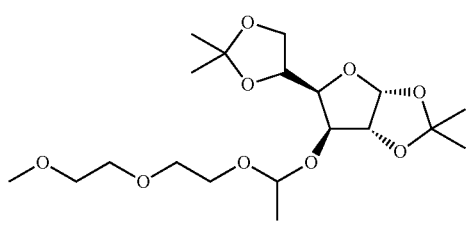
S-53
S-54
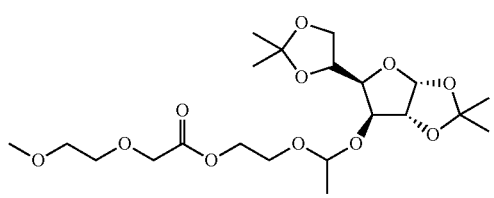
S-55
S-56
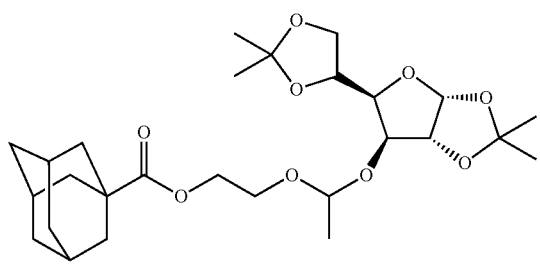
S-57
S-58
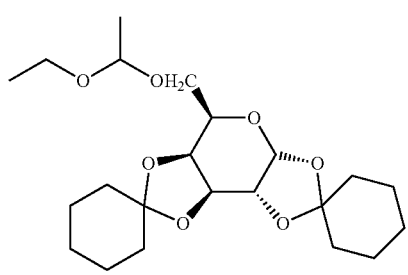
S-59
S-60
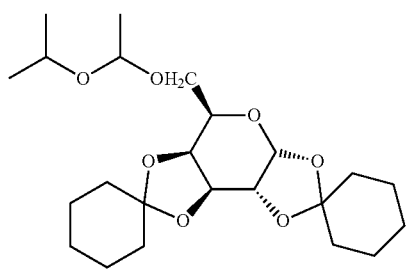
S-61

S-62
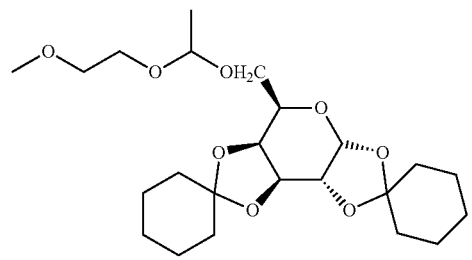
S-63
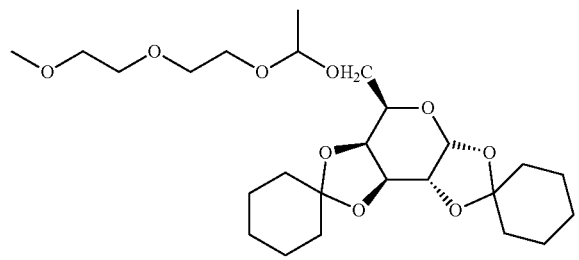
S-64
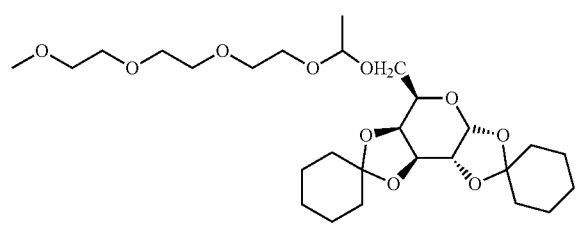
S-65
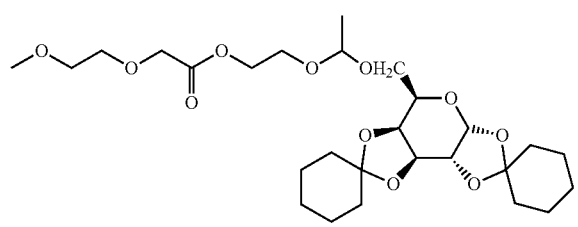
S-66
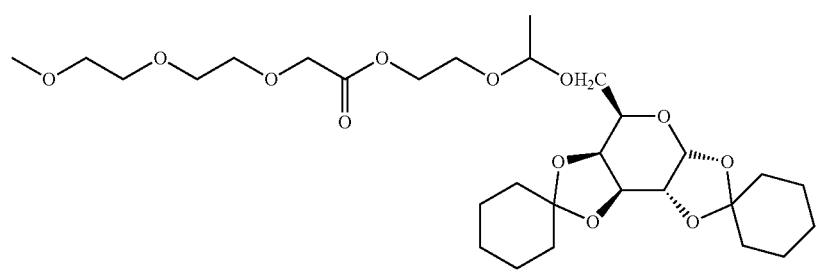
S-67
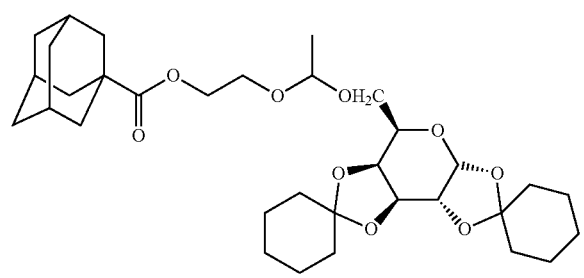
S-68
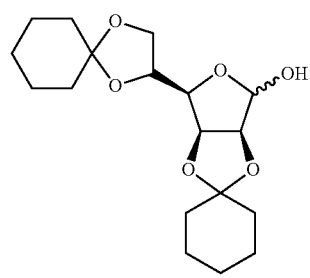
S-69
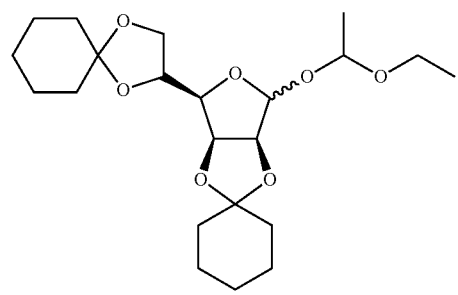
S-70
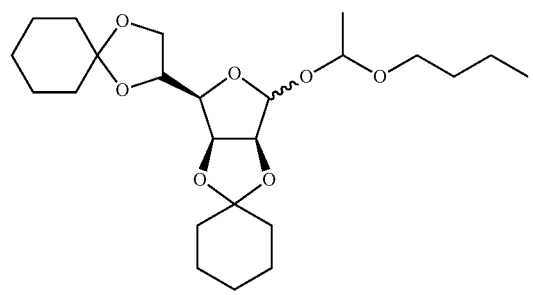

-continued
S-71
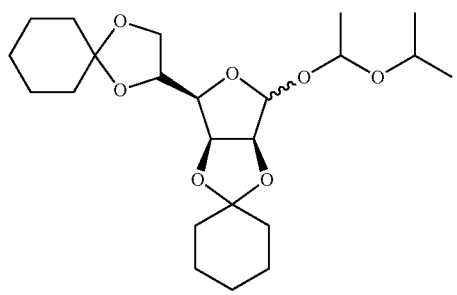
S-72
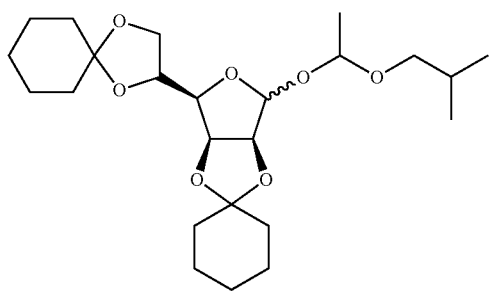
S-73
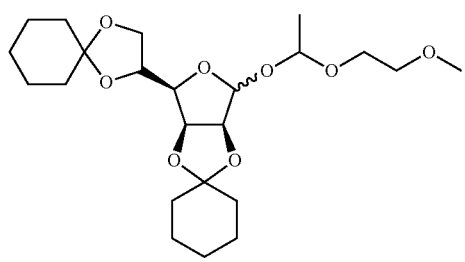
S-74
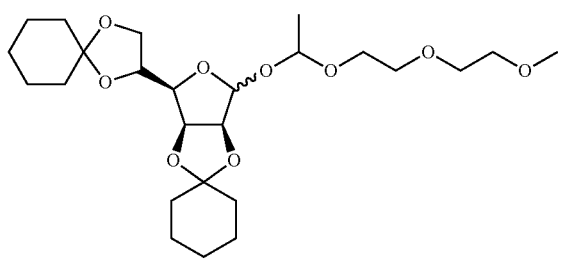
S-75
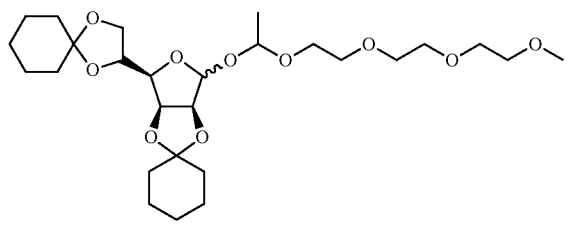
S-76
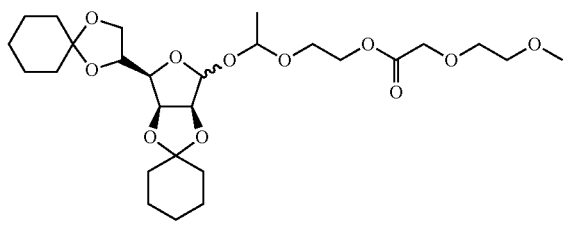
S-77
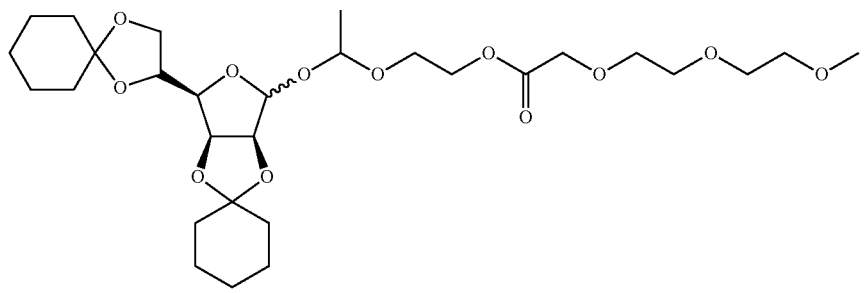
S-78
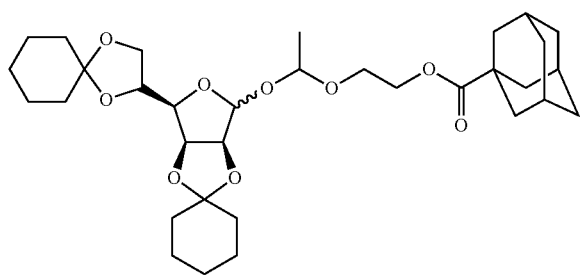
S-79
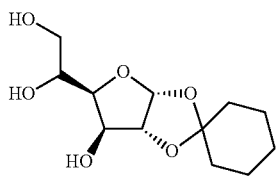

-continued
| S-80 | S-81 |
|---|---|
| 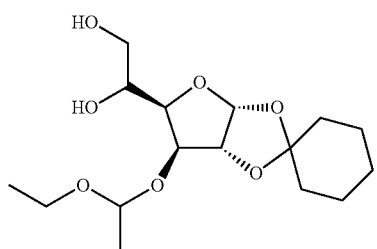 | 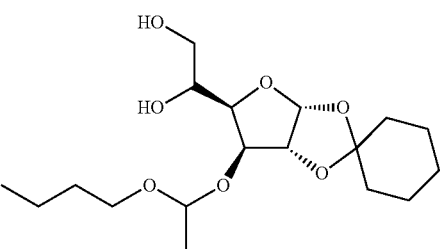 |
| S-82 | S-83 |
| 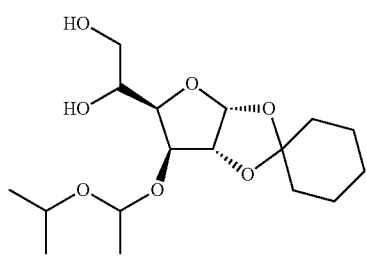 | 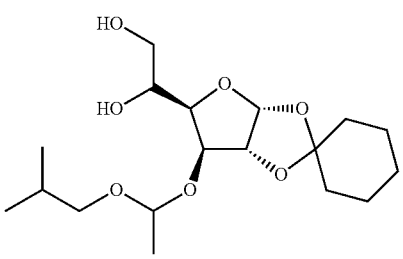 |
| S-84 | S-85 |
| 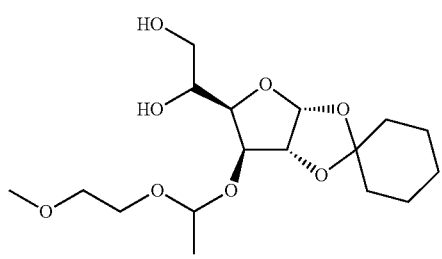 | 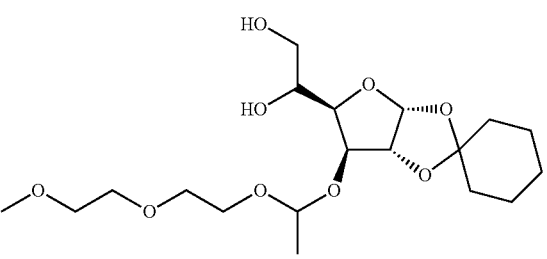 |
| S-86 | S-87 |
| 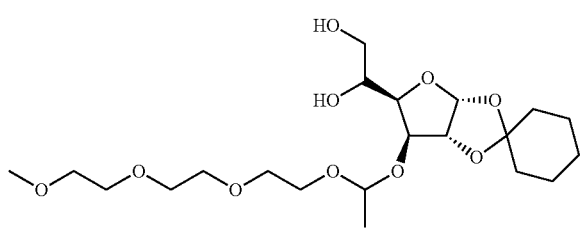 | 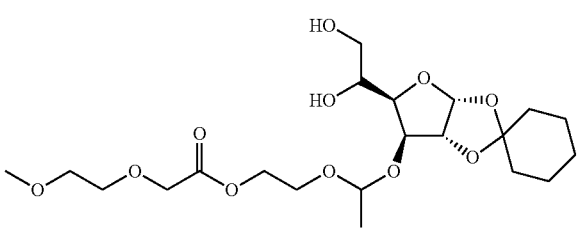 |
| S-88 | S-89 |
| 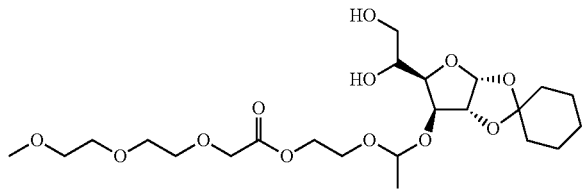 | 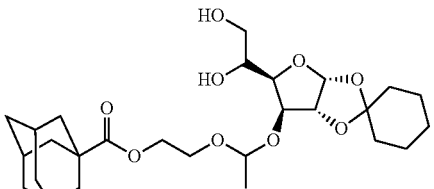 |
| S-90 | S-91 |
| 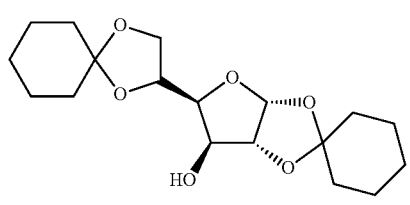 | 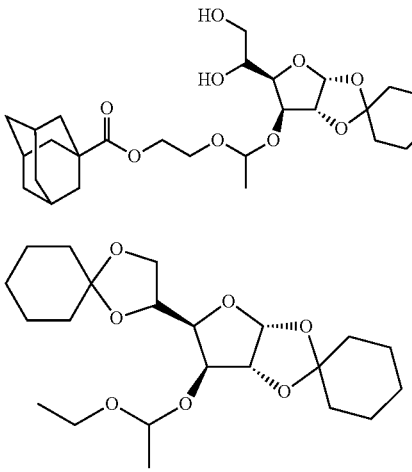 |

S-92
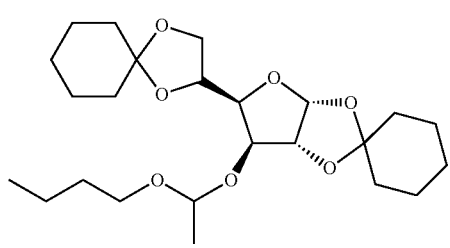
S-93
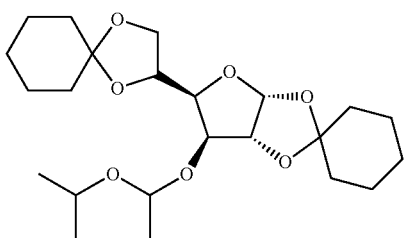
S-94
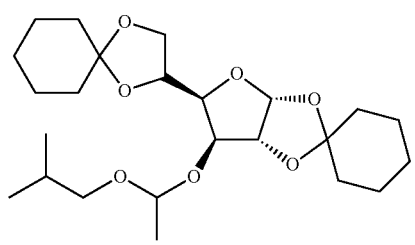
S-95
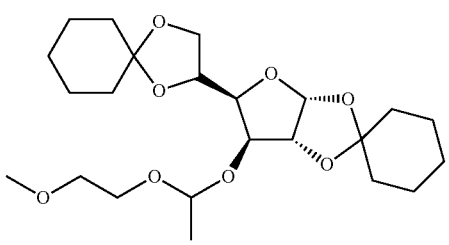
S-96
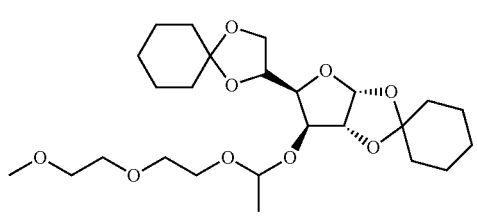
S-97
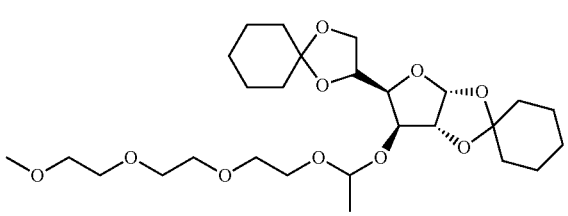
S-98
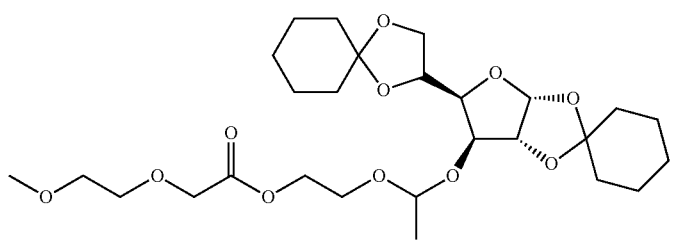
S-99
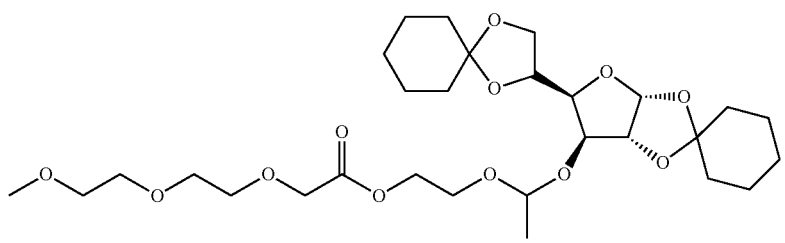
S-100
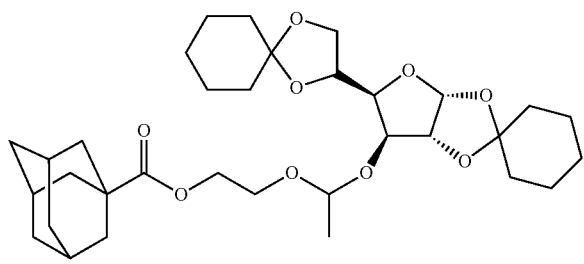
S-101
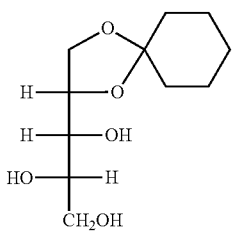

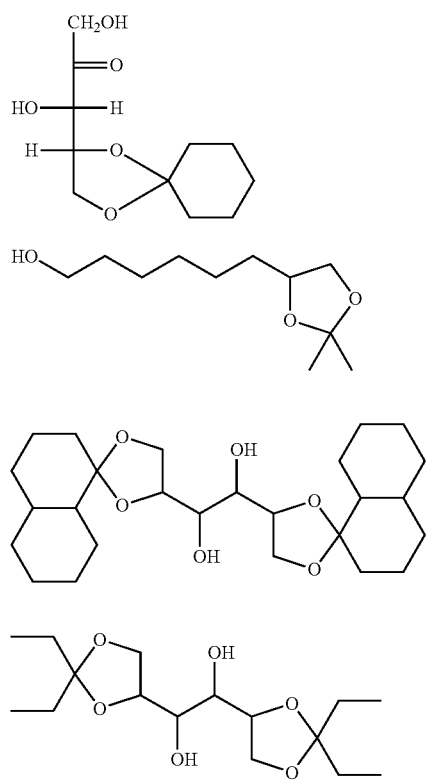

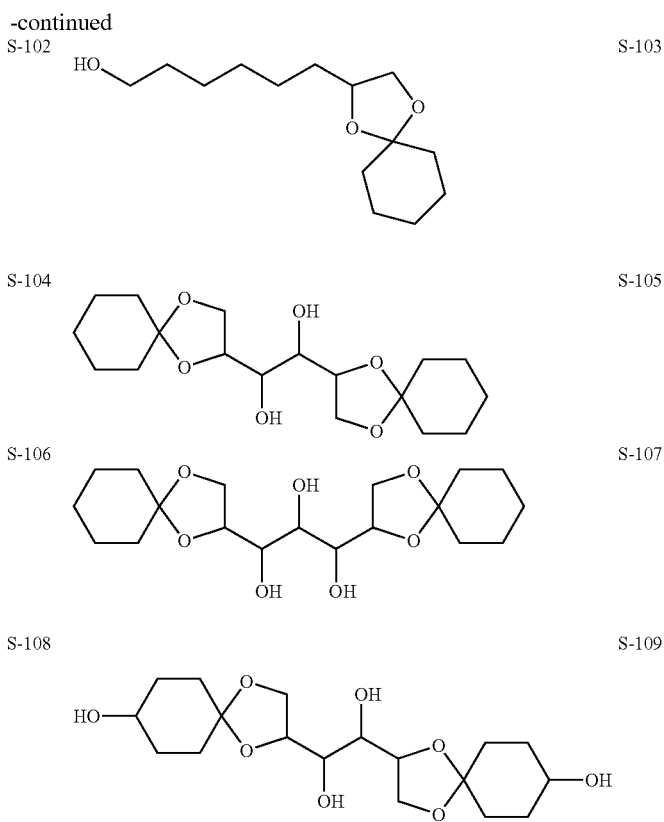

The "chain sugar derivative" as used in the present invention indicates a compound having a ring-opened structure of general sugar or a structure analogous thereto.

Specific examples thereof include threitol, erythritol, adonitol, arabitol, xylitol, sorbitol, mannitol, iditol, dulcitol, erythrol, xylulose, ribulose, deoxyribulose, glucero-gulo-heptose, and the compounds shown below

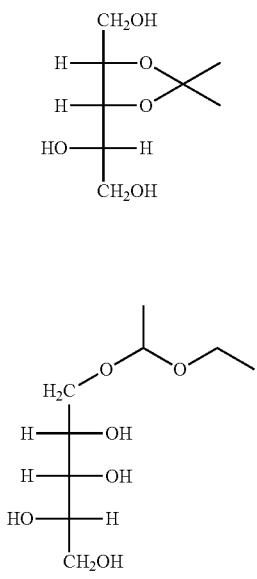

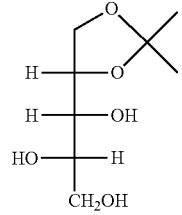

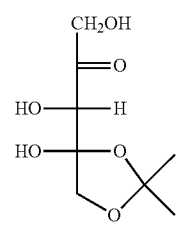

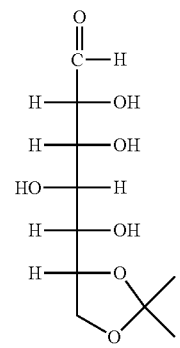

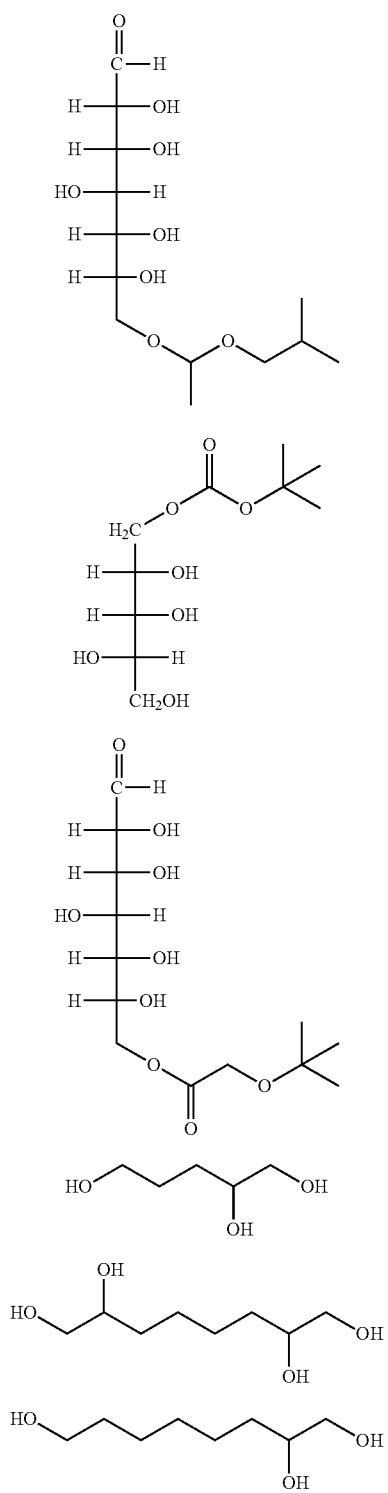

The compounds above have an optical isomer depending on the structure, but all optical isomers are included in the compounds. The hydroxyl group of these compounds may be substituted by an acid-degradable group such as acetal group and isopropylidene group, or other substituents depending on the case.

However, the present invention is not limited to these compounds anyway.

One of these compounds of the component (D) is used alone, or two or more thereof are used.

The amount used of the compound of the component (D) is preferably from 0.001 to 10 mass %, more preferably from 0.01 to 5 mass %, based on the solid content of the actinic ray-sensitive or radiation-sensitive resin composition. That is, the amount used is preferably 0.001 mass % or more for obtaining a sufficiently high addition effect and is preferably 10 mass % or less in view of sensitivity or developability of the unexposed area.

[6] (E) Surfactant

The actinic ray-sensitive or radiation-sensitive resin composition of the present invention preferably further contains a surfactant. The surfactant is preferably a fluorine-containing and/or silicon-containing surfactant.

Examples of the surfactant above include Megaface F176 and Megaface R08 produced by Dainippon Ink & Chemicals, Inc.; PF656 and PF6320 produced by OMNOVA; Troysol S-366 produced by Troy Chemical; Florad FC430 produced by Sumitomo 3M Inc.; and polysiloxane polymer KP-341 produced by Shin-Etsu Chemical Co., Ltd.

A surfactant other than the fluorine-containing and/or silicon-containing surfactant may also be used. Specific examples thereof include polyoxyethylene alkyl ethers and polyoxyethylene alkylaryl ethers.

In addition, known surfactants may be arbitrarily used. Examples of the surfactant which can be used include surfactants described in paragraph [0273] et seq. of U.S. Patent Application Publication No. 2008/0248425A1.

One kind of a surfactant may be used alone, or two or more kinds of surfactants may be used in combination.

The amount of the surfactant used is preferably from 0.0001 to 2 mass %, more preferably from 0.001 to 1 mass %, based on the entire solid content of the composition.

[7] (F) Solvent

The actinic ray-sensitive or radiation-sensitive resin composition of the present invention is dissolved in a solvent capable of dissolving respective components described above and then applied on a support. Usually, the concentration is, in terms of the solid content concentration of all components of the composition, preferably from 2 to 30 mass %, more preferably from 3 to 25 mass %.

Preferred examples of the solvent that can be used here include ethylene dichloride, cyclohexanone, cyclopentanone, anisole, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether (PGME, another name: 1-methoxy-2-propanol), propylene glycol monomethyl ether acetate (PGMEA, another name: 1-methoxy-2-acetoxypropane), toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran. One of these solvents may be used alone, or some of them may be mixed and used.

In particular, the solvent used in the actinic ray-sensitive or radiation-sensitive resin composition of the present invention is preferably a solvent containing an alkylene glycol monoalkyl ether carboxylate or an alkyl lactate. Specific preferred examples of the alkylene glycol monoalkyl ether carboxylate include propylene glycol monomethyl ether acetate, and specific preferred examples of the alkyl lactate include ethyl lactate.

Above all, the solvent for use in the composition of the present invention is preferably a mixed solvent containing propylene glycol monomethyl ether acetate, more preferably a mixed solvent of propylene glycol monomethyl ether acetate and propylene glycol monomethyl ether, or a mixed solvent of propylene glycol monomethyl ether acetate and ethyl lactate.

Particularly, propylene glycol monomethyl ether acetate is preferably contained in a ratio of 50 mass % or more, more preferably 60 mass % or more, based on all solvents.

The amount of the solvent used in the composition is not particularly limited, but the solvent is used to give a composition having an entire solid content concentration of preferably from 0.5 to 50 mass %, more preferably from 1.0 to 30 mass %, still more preferably from 1.5 to 20 mass %.

[8] Other Components

In addition, the actinic ray-sensitive or radiation-sensitive resin composition of the present invention may arbitrarily contain, for example, a compound capable of generating a carboxylic acid upon irradiation with an actinic ray or radiation, a carboxylic acid such as benzoic acid, a dye, a photobase generator, an antioxidant (for example, a phenol-based antioxidant disclosed in paragraphs 0130 to 0133 of JP-A-2006-276688), and a compound capable of producing an acid upon irradiation with radiation to decrease the basicity or become neutral described in JP-A-2006-330098 and Japanese Patent 3,577,743.

[9] Pattern Forming Method

The pattern forming method of the present invention includes steps of exposing and developing a resist film formed from the above-described actinic ray-sensitive or radiation-sensitive resin composition.

More specifically, the actinic ray-sensitive or radiation-sensitive resin composition of the present invention is preferably applied on a substrate to form a thin film as a resist film. The thickness of this coating film is preferably from 0.05 to 4.0 μm. The substrate may be selected from various substrates used in the production of a semiconductor.

The actinic ray-sensitive or radiation-sensitive resin composition of the present invention has an excellent effect that even when the composition is applied directly on a substrate having a high-reflection surface without applying an antireflection film, generation of a standing wave is remarkably suppressed and a good pattern is obtained, but a good pattern can be formed also when an antireflection film is used. In use for implantation, an antireflection film can be used as an overlayer of the resist, if desired. In this case, the antireflection film is preferably an inorganic film such as titanium, titanium dioxide, titanium nitride, chromium oxide, carbon, amorphous silicon, silicon dioxide and silicon nitride.

Examples of the antireflection film include AQUATAR-II, AQUATAR-III and AQUATAR-VII produced by AZ Electronic Materials K.K.

In the production or the like of a precision integrated circuit device, the step of forming a pattern on a resist film is performed by applying the actinic ray-sensitive or radiation-sensitive resin composition of the present invention on a substrate (for example, a silicon/silicon dioxide-coated substrate, a glass substrate, an ITO substrate or a quartz/chromium oxide-coated substrate) to form a resist film, irradiating an actinic ray or radiation such as KrF excimer laser light, electron beam and EUV light, and then subjecting the resist film to heating, development, rinsing and drying, whereby a good resist pattern can be formed.

The alkali developer which can be used in the development is an aqueous solution of an alkali (usually, from 0.1 to 20 mass %) such as inorganic alkalis (e.g., sodium hydroxide, potassium hydroxide, sodium carbonate, sodium silicate, sodium metasilicate, aqueous ammonia), primary amines (e.g., ethylamine, n-propylamine), secondary amines (e.g., diethylamine, di-n-butylamine), tertiary amines (e.g., triethylamine, methyldiethylamine), alcohol amines (e.g., dimethylethanolamine, triethanolamine), quaternary ammonium salts (e.g., tetramethylammonium hydroxide, tetraethylammonium hydroxide, choline) and cyclic amines (e.g., pyrrole, piperidine). In this aqueous solution of an alkali, alcohols such as isopropyl alcohol and a surfactant such as nonionic surfactant may be added each in an appropriate amount.

Among these developers, a quaternary ammonium salt is preferred, and tetramethylammonium hydroxide (TMAH) and choline are more preferred.

The pH of the alkali developer is usually from 10 to 15.

Examples of the actinic ray or radiation as an exposure light source include infrared light, visible light, ultraviolet light, far ultraviolet light, X-ray and electron beam, but the radiation is preferably far ultraviolet light at a wavelength of 250 nm or less, more preferably 220 nm or less, still more preferably from 1 to 200 nm. Specific examples thereof include KrF excimer laser (248 nm), ArF excimer laser (193 nm), $F_2$ excimer laser (157 nm), X-ray, electron beam and EUV. The resist film is preferably exposed by the irradiation with KrF, electron beam, X-ray or EUV.

EXAMPLES

The present invention is described in greater detail below by referring to Examples, but the contents of the present invention should not be construed as being limited thereto.

Synthesis Example 1

Synthesis of Polymer {(A-1)-1}

31.63 Gram (0.195 mol) of 4-acetoxystyrene, 13.65 g (0.096 mol) of tert-butyl methacrylate, 2.14 g (0.009 mol) of (4-phenyl)phenyl methacrylate and 3.45 g (0.015 mol) of polymerization initiator V-601 (produced by Wako Pure Chemical Industries, Ltd.) were dissolved in 151.75 g of cyclohexanone. Subsequently, 37.94 g of cyclohexanone was charged into a reaction vessel, and the solution above was added dropwise to the system at 80° C. over 6 hours in a nitrogen gas atmosphere. After the completion of dropwise addition, the reaction solution was stirred for 2 hours, then allowed to cool to room temperature and added dropwise in 2.5 L of hexane to precipitate a polymer, followed by filtration. The solid collected by filtration was washed by splashing 500 mL of hexane thereon and then dried under reduced pressure to obtain 42.68 g of a 4-acetoxystyrene/tert-butyl methacrylate/(4-phenyl)phenyl methacrylate copolymer.

In a reaction vessel, 40.00 g of the polymer obtained above was dissolved in 92 mL of ethyl acetate and 92 mL of methanol, 39.05 g of a sodium methoxide 28% methanol solution was added thereto and after stirring for 3 hours, hydrochloric acid was added to make the solution acidic. Furthermore, 500 mL of ethyl acetate was added, and washing with 200 mL of distilled water was performed 5 times. The organic layer was extracted, concentrated, dissolved in 150 mL of methanol and added dropwise in 1.5 L of distilled water/methanol=7/3 (by volume) to precipitate a polymer, followed by filtration. The solid collected by filtration was washed by splashing 500 mL of distilled water/methanol=7/3 (by volume) thereon and then dried under reduced pressure to obtain 29.77 g of a 4-hydroxystyrene/tert-butyl methacrylate/(4-phenyl)phenyl methacrylate copolymer. The weight average molecular weight by GPC was 20,000, and the molecular weight polydispersity (Mw/Mn) was 1.47.

Resins shown in Table 1 were synthesized in the same manner as in Synthesis Example 1 except for changing the kind and amount of monomers. The compositional ratio of resin, the weight average molecular weight (Mw), and the molecular weight polydispersity (Mw/Mn) are shown in Table 1. Incidentally, all of the structures of (A-1)-1 to (A-1)-6 are A-1 above and differ in the compositional ratio, molecular weight or polydispersity from each other.

TABLE 1

| Resin | Composition Ratio (mol %) | | | | Weight average molecular weight (Mw) | Polydispersity (Mw/Mn) |
|---|---|---|---|---|---|---|
| | (I) | (II) | (III) | Others | | |
| (A-1)-1 | 64 | 33 | 3 | — | 20000 | 1.47 |
| (A-1)-2 | 68 | 30 | 2 | — | 18000 | 1.55 |
| (A-1)-3 | 71 | 25 | 4 | — | 17000 | 1.48 |
| (A-1)-4 | 64 | 27 | 9 | — | 18000 | 1.53 |
| (A-1)-5 | 72 | 20 | 8 | — | 18500 | 1.50 |
| (A-1)-6 | 67 | 20 | 13 | — | 19500 | 1.52 |
| (Z-1) | 70 | 20 | — | 10 | 15000 | 1.58 |

(Z-1)

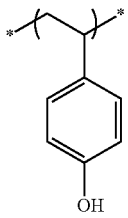

TABLE 1-continued

| Resin | Composition Ratio (mol %) | | | | Weight average molecular weight (Mw) | Polydispersity (Mw/Mn) |
|---|---|---|---|---|---|---|
| | (I) | (II) | (III) | Others | | |

[Preparation of Actinic Ray-Sensitive or Radiation-Sensitive Resin Composition]

A resin, an acid generator, an organic basic compound and a surfactant were dissolved in a mixed or sole solvent of propylene glycol monomethyl ether acetate (hereinafter simply referred to as "PGMEA"), propylene glycol monomethyl ether (hereinafter simply referred to as "PGME") and ethyl lactate (hereinafter simply referred to as "EL") to prepare a solution having a solid content concentration of 9.0 mass %, and the obtained solution was microfiltered through a membrane filter having a pore size of 0.1 μm to obtain a positive resist solution (an actinic ray-sensitive or radiation-sensitive resin composition).

The resist solutions used for evaluation are shown in Table 2 below. Here, the amount added (mass %) of each component except for a solvent means mass % based on the solid content excluding the solvent. As for the solvent, a mixing ratio (mass %) of PGMEA, PGME and EL is shown.

TABLE 2

| | Resin (A) (mass %) | Acid Generators (B) and (B') (mass %) | Basic Compound (C) (mass %) | Compound (D) (mass %) | Surfactant (E) (mass %) | Solvent PGMEA (mass %) | PGME (mass %) | EL (mass %) |
|---|---|---|---|---|---|---|---|---|
| Example 1 | (A-1)-1 (95.5) | B-1/B-5 (3.0/1.0) | C-1 (0.4) | — | E-1 (0.1) | 60 | 40 | 0 |
| Example 2 | (A-1)-1 (95.5) | B-1/B-5 (2.0/2.0) | C-1 (0.4) | — | E-1 (0.1) | 60 | 0 | 40 |
| Example 3 | (A-1)-1 (95.5) | B-1/B-6 (2.0/2.0) | C-2 (0.4) | — | E-2 (0.1) | 60 | 0 | 40 |
| Example 4 | (A-1)-1/(A-1)-2 (40.5/55.0) | B-1/B-6 (2.0/2.0) | C-1/C-2 (0.1/0.3) | — | E-3 (0.1) | 60 | 40 | 0 |
| Example 5 | (A-1)-2 (95.5) | B-2 (4.0) | C-1 (0.4) | — | E-1 (0.1) | 60 | 40 | 0 |
| Example 6 | (A-1)-1 (95.5) | B-3 (4.0) | C-1 (0.4) | — | E-2 (0.1) | 80 | 20 | 0 |
| Example 7 | (A-1)-3 (95.5) | B-1/B-4 (2.0/2.0) | C-1/C-3 (0.1/0.3) | — | E-1 (0.1) | 60 | 40 | 0 |
| Example 8 | (A-1)-2 (95.5) | B-1/B-7 (3.0/1.0) | C-1 (0.4) | — | E-2 (0.1) | 60 | 40 | 0 |
| Example 9 | (A-1)-1 (95.5) | B-1/B-8 (3.0/1.0) | C-1 (0.5) | — | — | 60 | 0 | 40 |
| Example 10 | (A-1)-3 (95.5) | B-2/B-7 (3.0/1.0) | C-1/C-3 (0.1/0.3) | — | E-1 (0.1) | 80 | 20 | 0 |
| Example 11 | (A-1)-4 (95.5) | B-1/B-5 (3.0/1.0) | C-1 (0.4) | — | E-1 (0.1) | 60 | 40 | 0 |
| Example 12 | (A-1)-5 (94.5) | B-1/B-5 (2.0/2.0) | C-1 (0.4) | D-1 (1.0) | E-1 (0.1) | 60 | 0 | 40 |
| Example 13 | (A-1)-6 (95.5) | B-1/B-5 (2.0/2.0) | C-1 (0.4) | — | E-1 (0.1) | 60 | 0 | 40 |

TABLE 2-continued
| | Resin (A) (mass %) | Acid Generators (B) and (B') (mass %) | Basic Compound (C) (mass %) | Compound (D) (mass %) | Surfactant (E) (mass %) | Solvent PGMEA (mass %) | PGME (mass %) | EL (mass %) |
|---|---|---|---|---|---|---|---|---|
| Comparative Example 1 | (Z-1) (95.5) | B-1/B-5 (2.0/2.0) | C-1 (0.4) | — | E-1 (0.1) | 60 | 40 | 0 |
(Acid Generator)
B-1
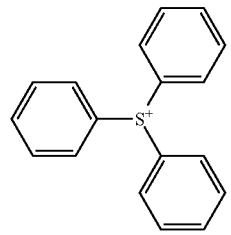 [SMILES: c1ccc([S+](c2ccccc2)c2ccccc2)cc1]
B-2
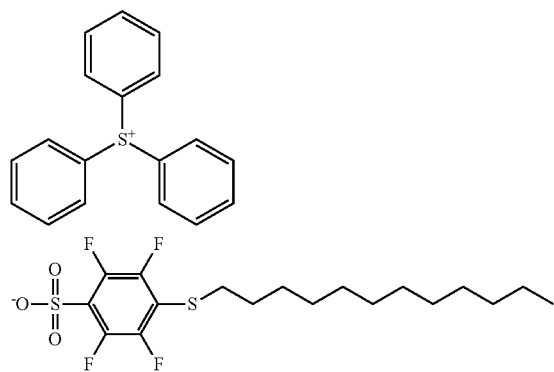
B-3
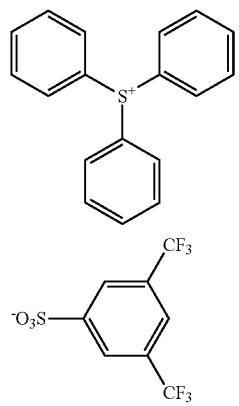
B-4
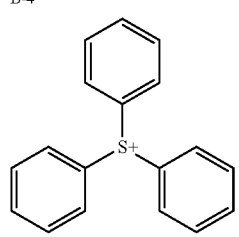

TABLE 2-continued

|  | Acid Generators | Basic Compound | Compound | Surfactant | Solvent | | |
|---|---|---|---|---|---|---|---|
| Resin (A) (mass %) | (B) and (B') (mass %) | (C) (mass %) | (D) (mass %) | (E) (mass %) | PGMEA (mass %) | PGME (mass %) | EL (mass %) |

B-5: pentafluorobenzenesulfonate

B-6: triphenylsulfonium p-toluenesulfonate

B-7: triphenylsulfonium butanesulfonate

B-8: bis(cyclohexylsulfonyl)diazomethane (polymeric bis-sulfonyl diazomethane structure)

(Organic Basic Compound)

C-1: Dicyclohexylmethylamine

C-2: Tetra-(n-butyl)ammonium hydroxide

C-3: (2,6-dimethoxyphenoxy-triethyleneglycol-N,N-bis(2-methoxyethyl)amine structure)

TABLE 2-continued

| | Resin (A) (mass %) | Acid Generators (B) and (B') (mass %) | Basic Compound (C) (mass %) | Compound (D) (mass %) | Surfactant (E) (mass %) | Solvent PGMEA (mass %) | PGME (mass %) | EL (mass %) |
|---|---|---|---|---|---|---|---|---|

(Compound (D))
D-1

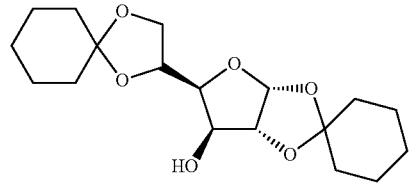 [SMILES: O[C@@H]1[C@H]2OC3(CCCCC3)O[C@H]2O[C@@H]1C1COC2(CCCCC2)O1]

(Surfactant)
E-1: Fluorine-containing surfactant, Megaface F-176 (produced by Dainippon Ink & Chemicals, Inc.)
E-2: Fluorine/silicon-containing surfactant, Megaface R08 (produced by Dainippon Ink & Chemicals, Inc.)
E-3: Silicon-containing surfactant, Polysiloxane Polymer KP-341 (produced by Shin-Etsu Chemical Co., Ltd.)

[Production and Evaluation of Pattern]

The positive resist solution prepared above was uniformly applied on a silicon wafer (high-reflection substrate) that is only treated with hexamethyldisilazane but not provided with an antireflection layer by using a spin coater, Mark 8, manufactured by Tokyo Electron Ltd. and dried under heating at 130° C. for 60 seconds to form a 0.4 μm-thick positive resist film. Thereafter, antireflection film AQUATAR-VII was applied as an overlayer of the obtained resist film by using a spin coater, Mark 8, manufactured by Tokyo Electron Ltd. and dried under heating at 90° C. for 60 seconds to form a 40 nm-thick antireflection layer. This film stack was then pattern-exposed using a KrF excimer laser scanner (PAS5500/850C, manufactured by ASML, wavelength: 248 nm) under the exposure conditions of NA=0.68 and σ=0.60. After the irradiation, the film stack was baked at 130° C. for 60 seconds, dipped in an aqueous 2.38 mass % tetramethylammonium hydroxide (TMAH) solution for 60 seconds, rinsed with water for 30 seconds and dried. The obtained pattern was evaluated by the following methods. The results are shown in Table 3.

(Exposure Latitude (EL))

With respect to a resist pattern obtained in the same manner as above, the line width was observed by a scanning electron microscope (S-8840, manufactured by Hitachi, Ltd.). The exposure dose $E_0$ at which a resist pattern of 150 nm in line width is obtained with a mask pattern having a mask size of 150 nm in line width and 300 nm in pitch was taken as effective sensitivity, and a value ($|E_2-E_1|/E_0$) (percentage) obtained by dividing the difference between an exposure dose $E_2$ causing an increase of line width of 10% and an exposure dose $E_1$ causing a decrease of line width of 10% by the effective exposure dose $E_0$ was taken as EL. Larger EL indicates higher resolution.

(Standing Wave)

The cross-sectional profile of a 150 nm-wide resist pattern was observed by a cross-sectional SEM, and the sample was rated A when the side surface was a substantially sheer wall and the effect of standing wave was suppressed, with 2A for better one, rated B when the side surface was slightly tapered but the effect of standing wave was suppressed, and rated C when the side surface was waving and the effect of standing wave came out.

(Film Loss)

With respect to the unexposed area, a difference obtained by subtracting the film thickness after development from the film thickness after the application was taken as the film loss.

(Swing Amplitude)

A positive resist film having a thickness of 0.2 μm, 0.25 μm, 0.30 μm, 0.35 μm, 0.40 μm, 0.45 μm, 0.50 μm, 0.55 μm or 0.6 μm was formed on a wafer (high-reflection substrate only treated with hexamethyldisilazane but not provided with an antireflection film, and antireflection film AQUATAR-VII was applied thereon to a thickness of 40 nm. This film stack was then pattern-exposed using a KrF excimer laser scanner (PAS5500/850C, manufactured by ASML, wavelength: 248 nm) under the exposure conditions of NA=0.68 and σ=0.60. After the irradiation, the film stack was baked at 130° C. for 60 seconds, dipped in an aqueous 2.38 mass % tetramethylammonium hydroxide (TMAH) solution for 60 seconds, rinsed with water for 30 seconds and dried.

The pattern formation above for the resist film in each thickness was performed with an exposure dose (effective sensitivity) at which a resist pattern having a line width of 150 nm is obtained for a resist film having a thickness of 0.40 μm by using a mask pattern with a mask size of 150 nm in line width and 300 nm in pitch, and the line width in each film thickness was measured. Each film thickness x and each line width y corresponding to the film thickness x were input into a software, igor pro (ver. 3.14), produced by Wave Metrics, and regression analysis was performed using a function sfit to compute a K1 value. A value twice the K1 value was taken as the swing amplitude. A smaller value of swing amplitude is better and indicates that the fluctuation of resist performance due to change in film thickness is smaller.

TABLE 3

| | EL (%) | Standing Wave | Film Loss (nm) | Swing Amplitude (nm) |
|---|---|---|---|---|
| Example 1 | 17 | 2A | 10 | 13 |
| Example 2 | 16 | 2A | 15 | 17 |
| Example 3 | 16 | 2A | 15 | 17 |
| Example 4 | 17 | A | 20 | 17 |
| Example 5 | 16 | A | 15 | 18 |
| Example 6 | 15 | A | 15 | 19 |
| Example 7 | 16 | A | 20 | 18 |
| Example 8 | 14 | A | 20 | 20 |
| Example 9 | 14 | 2A | 20 | 20 |
| Example 10 | 15 | 2A | 20 | 22 |
| Example 11 | 10 | B | 20 | 20 |
| Example 12 | 18 | 2A | 10 | 13 |
| Example 13 | 11 | B | 25 | 23 |
| Comparative Example 1 | 8 | C | 50 | 40 |

As seen from the results in Table 3, according to Examples 1 to 13 using the actinic ray-sensitive or radiation-sensitive resin composition of the present invention, as compared with Comparative Example 1 using a resin not having a repeating unit represented by formula (III) of the present invention, even when a high-reflection substrate is directly used without an antireflection film in microfabrication using KrF excimer laser light, a pattern reduced in the increase of a swing amplitude and the generation of a standing waver and assured of high resolution and little film loss can be provided.

INDUSTRIAL APPLICABILITY

According to the present invention, an actinic ray-sensitive or radiation-sensitive resin composition containing a specific acid-decomposable resin and a specific acid generator and thereby enabling it to suppress increase of a swing amplitude and generation of a standing wave and achieve high resolution and little film loss, a resist film using the composition, and a pattern forming method can be provided. The actinic ray-sensitive or radiation-sensitive resin composition of the present invention is suitable as a positive resist composition.

The entire disclosure of Japanese Patent Application Nos. 2009-077760 and 2009-288255 filed on Mar. 26, 2009 and Dec. 18, 2009 respectively, from which the benefit of foreign priority has been claimed in the present application, is incorporated herein by reference, as if fully set forth.

The invention claimed is:

1. An actinic ray-sensitive or radiation-sensitive resin composition comprising:
   (A) a resin capable of increasing the solubility in an alkali developer by the action of an acid, the resin containing a repeating unit represented by formula (I), a repeating unit represented by formula (II) and a repeating unit represented by formula (III),
   (B) a compound capable of generating a fluorine atom-containing sulfonic acid upon irradiation with an actinic ray or radiation, and
   (B') a compound capable of generating a fluorine atom-free sulfonic acid upon irradiation with an actinic ray or radiation:

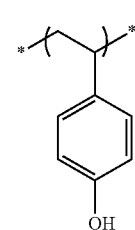

(I)

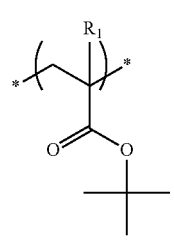

(II)

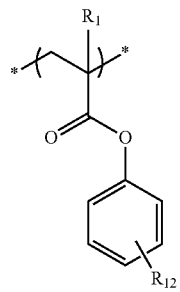

(III)

wherein
each of $R_1$ and $R_{11}$ independently represents a hydrogen atom or an alkyl group which may have a substituent, and
$R_{12}$ represents a phenyl group which may have a substituent,
wherein the content of the component (B) is from 1.0 to 15 mass %, and the content of the component (B') is from 0.5 to 3 mass %, based on the entire solids content of the composition.

2. The actinic ray-sensitive or radiation-sensitive resin composition as claimed in claim 1, wherein
the contents of the repeating unit represented by formula (I), the repeating unit represented by formula (II) and the repeating unit represented by formula (III) are from 50 to 80 mol %, from 15 to 49 mol % and from 0.5 to 10 mol %, respectively, based on all repeating units of the resin (A).

3. The actinic ray-sensitive or radiation-sensitive resin composition as claimed in claim 1, wherein
the contents of the repeating unit represented by formula (I), the repeating unit represented by formula (II) and the repeating unit represented by formula (III) are from 60 to 75 mol %, from 20 to 39 mol % and from 1 to 9 mol %, respectively, based on all repeating units of the resin (A).

4. The actinic ray-sensitive or radiation-sensitive resin composition as claimed in claim 1, wherein
each of $R_1$ in formula (II) and $R_{11}$ in formula (III) is a methyl group.

5. The actinic ray-sensitive or radiation-sensitive resin composition as claimed in claim 1, wherein
$R_{12}$ in formula (III) is a phenyl group.

6. The actinic ray-sensitive or radiation-sensitive resin composition as claimed in claim 1, further comprising:
   (D) a compound having three or more hydroxyl or substituted hydroxyl groups.

7. The actinic ray-sensitive or radiation-sensitive resin composition as claimed in claim 6, wherein
the compound (D) is a cyclic or chain sugar derivative.

8. A resist film formed of the actinic ray-sensitive or radiation-sensitive resin composition claimed in claim 1.

9. A pattern forming method comprising steps of exposing and developing the resist film claimed in claim 8.

10. The actinic ray-sensitive or radiation-sensitive resin composition as claimed in claim 1, wherein
the component (B) is a sulfonium salt or an iodonium salt, and the component (B') is a sulfonium salt or an iodonium salt.

* * * * *